(12) United States Patent
Kandori et al.

(10) Patent No.: US 8,596,121 B2
(45) Date of Patent: Dec. 3, 2013

(54) STRUCTURAL MEMBER HAVING A PLURALITY OF CONDUCTIVE REGIONS

(75) Inventors: Atsushi Kandori, Ebina (JP); Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 350 days.

(21) Appl. No.: 12/520,878

(22) PCT Filed: Jan. 10, 2008

(86) PCT No.: PCT/JP2008/050561
§ 371 (c)(1),
(2), (4) Date: Jun. 23, 2009

(87) PCT Pub. No.: WO2008/088032
PCT Pub. Date: Jul. 24, 2008

(65) Prior Publication Data
US 2010/0107758 A1    May 6, 2010

(30) Foreign Application Priority Data
Jan. 19, 2007    (JP) .................................. 2007-009657

(51) Int. Cl.
*G01C 19/00*    (2013.01)
(52) U.S. Cl.
USPC ...................................................... 73/504.08
(58) Field of Classification Search
USPC .............. 73/514.01, 514.16, 504.08; 427/58; 324/72; 310/309; 174/262
See application file for complete search history.

(56) References Cited

U.S. PATENT DOCUMENTS

| 4,618,397 A | * | 10/1986 | Shimizu et al. ................. 438/53 |
| 4,766,666 A | * | 8/1988 | Sugiyama et al. ........... 29/621.1 |
| 4,853,348 A | * | 8/1989 | Tsubouchi et al. ........... 438/246 |
| 5,165,282 A | * | 11/1992 | Nakamura et al. .............. 73/727 |
| 5,242,863 A | * | 9/1993 | Xiang-Zheng et al. ......... 438/53 |
| 5,514,898 A | * | 5/1996 | Hartauer ........................ 257/417 |
| 5,531,121 A | * | 7/1996 | Sparks et al. ................... 73/716 |
| 5,583,296 A | * | 12/1996 | Mokwa et al. .................. 73/718 |
| 5,654,237 A | * | 8/1997 | Suguro et al. ................. 438/624 |

(Continued)

FOREIGN PATENT DOCUMENTS

| EP | 71203 | 2/1983 |
| JP | 61-100626 | 5/1986 |

(Continued)

OTHER PUBLICATIONS

Notification Concerning Transmittal of International Preliminary Report on Patentability (Chapter I of the Patent Cooperation Treaty), International Preliminary Report on Patentability (Chapter I of the Patent Cooperation Treaty), and Written Opinion of the International Searching Authority, dated Jul. 30, 2009, issued in International Application No. PCT/JP2008/050561.

(Continued)

*Primary Examiner* — Peter Macchiarolo
*Assistant Examiner* — Samir M Shah
(74) *Attorney, Agent, or Firm* — Fitzpatrick, Cella, Harper & Scinto

(57) ABSTRACT

A structural member having a plurality of conductive regions electrically insulated from each other, in which the plurality of conductive regions are electrically insulated from each other by continuous oxidized regions, and the oxidized regions are each formed of an oxide made of a material having a plurality of through holes or trenches formed therein.

10 Claims, 20 Drawing Sheets

(56) References Cited

U.S. PATENT DOCUMENTS

| | | | |
|---|---|---|---|
| 5,672,551 A * | 9/1997 | Fung | 438/53 |
| 5,786,235 A * | 7/1998 | Eisele et al. | 438/53 |
| 5,930,595 A * | 7/1999 | Sridhar et al. | 438/52 |
| 5,998,302 A * | 12/1999 | Fujisawa | 438/706 |
| 6,017,791 A * | 1/2000 | Wang et al. | 438/253 |
| 6,046,067 A * | 4/2000 | Werner | 438/52 |
| 6,078,016 A * | 6/2000 | Yoshikawa et al. | 200/181 |
| 6,093,330 A * | 7/2000 | Chong et al. | 216/2 |
| 6,225,140 B1 | 5/2001 | Liu et al. | 438/48 |
| 6,242,079 B1 * | 6/2001 | Mikado et al. | 428/209 |
| 6,294,744 B1 * | 9/2001 | Kinoshita | 174/262 |
| 6,388,300 B1 | 5/2002 | Kano et al. | 257/419 |
| 6,605,487 B2 * | 8/2003 | Franosch et al. | 438/50 |
| 6,716,661 B2 * | 4/2004 | Zou et al. | 438/49 |
| 6,737,692 B2 * | 5/2004 | Gabric et al. | 257/295 |
| 7,172,971 B2 * | 2/2007 | Jeon et al. | 438/701 |
| RE40,781 E * | 6/2009 | Johannsen et al. | 381/174 |
| 7,605,076 B2 * | 10/2009 | Honda et al. | 438/637 |
| 2003/0047804 A1 | 3/2003 | Otani | 257/723 |
| 2003/0164041 A1 | 9/2003 | Jeong et al. | 73/504.08 |
| 2006/0121735 A1 | 6/2006 | Aikele et al. | 438/689 |
| 2007/0080382 A1 * | 4/2007 | Kikuchi et al. | 257/295 |
| 2009/0061537 A1 | 3/2009 | Tomiyoshi et al. | 438/3 |
| 2010/0003816 A1 * | 1/2010 | Honda et al. | 438/653 |
| 2010/0052019 A1 * | 3/2010 | Yamamoto et al. | 257/288 |

FOREIGN PATENT DOCUMENTS

| | | |
|---|---|---|
| JP | 4-025764 | 1/1992 |
| JP | 8-050022 | 2/1996 |
| JP | 8-083940 | 3/1996 |
| JP | 2000-058802 | 2/2000 |
| JP | 2000-65855 | 3/2000 |
| JP | 2000-286430 | 10/2000 |
| JP | 2002-148047 | 5/2002 |
| JP | 2003-247831 | 9/2003 |
| JP | 2007-075978 | 3/2007 |
| JP | 2007-253304 | 10/2007 |
| TW | I265602 B | 11/2006 |
| WO | WO 2004/026759 A2 | 4/2004 |
| WO | WO 2004/051739 A1 | 6/2004 |

OTHER PUBLICATIONS

D.B. Kao et al., "Two-Dimensional Thermal Oxidation of Silicon- I. Experiments", *IEEE Trans. on Electron Devices*, vol. ED-34, No. 5, pp. 1008-1017, May 1987.

Office Action dated Apr. 3, 2012, issued in counterpart Japanese Patent Application No. 2007-009657.

H. Schenk et al., "Large Deflection Micromechanical Scanning Mirrors for Linear Scans and Pattern Generation", *IEEE Journal of Selected Topics in Quantum Electronics*, vol. 6, No. 5, pp. 715-722 (Sep./Oct. 2000).

Office Action dated Jan. 20, 2012, issued in counterpart Korean Patent Application No. 10-2009-7016626, with translation.

English-language translation of Office Action dated Apr. 3, 2012, issued in counterpart Japanese Patent Application No. 2007-009657.

* cited by examiner

STRUCTURAL MEMBER HAVING A PLURALITY OF CONDUCTIVE REGIONS

TECHNICAL FIELD

The present invention relates to a structural member having a plurality of conductive regions, such as a microstructural member having a plurality of regions electrically insulated from each other, and to a method of producing the same. The present invention also relates to devices having the structural member used therein, such as an acceleration sensor, a gyroscope, an electric potential sensor, and an actuator.

BACKGROUND ART

There has been known, as a conventional microstructural member to be produced using a technology of micro-electromechanical systems (MEMS) or the like, a structural member which is divided into a plurality of regions electrically insulated from each other and which is used as an electrode so as to perform driving, control, and detection of a displacement and the like by using electrical signals, with respect to a structural member and a movable member. With such a structure, an actuator having a plurality of driving force generating mechanisms, a sensor having a plurality of electrostatic detection portions, and the like can be easily achieved. Specific examples thereof will be described below.

Japanese Patent Application Laid-Open No. 2000-065855 discloses a semiconductor acceleration switch of a structure in which an insulator is provided between a plurality of movable electrodes to be used as beam portions. FIG. 13 is a perspective view of the acceleration switch disclosed in Japanese Patent Application Laid-Open No. 2000-065855. In FIG. 13, the acceleration switch includes a support substrate 901, a fixed portion 902, a movable portion 903, a fixed electrode 905, a control electrode 906, and stoppers 907a and 907b. Further, the acceleration switch includes a supporting portion 908, beams 909, 991, and 992, a mass member 910, movable electrodes 911 and 913, a frame portion 916, an insulating film 917, a movable portion main body 930, terminals 981 and 982, and an electrode 961. In such structure, the insulating film 917 is formed between the movable electrodes 911 and 913, thereby forming the beam 909. By the beam 909, the mass member 910 which is applied with an acceleration to be input is held. The plurality of movable electrodes 911 and 913 included in the beam 909 are insulated from each other, and sensor characteristics are controlled between the movable electrode 911 and the fixed electrode 902, whereby the acceleration can be detected between the movable electrode 913 and the fixed electrode 905. In the structure disclosed in Japanese Patent Application Laid-Open No. 2000-065855, in each of deep and narrow trenches formed in the silicon substrate, the insulating film 917 such as a spin-on-glass (SOG), a thermally oxidized film, or a polysilicon is formed.

Further, Japanese Patent Application Laid-Open No. 2000-286430 discloses a semiconductor dynamic quantity sensor having a structure in which insulating films are embedded in a supporting portion for beams and in a supporting portion for electrostatic comb teeth so as to be insulated from other portions. FIG. 14 is a perspective view of the semiconductor dynamic quantity sensor disclosed in Japanese Patent Application Laid-Open No. 2000-286430. As illustrated in FIG. 14, the semiconductor dynamic quantity sensor includes a single crystal silicon substrate 1, trenches 4a to 4d, a square frame portion 5, a beam structural member 6, anchor portions 7 and 8, beam portions 9 and 10, a mass portion 11, movable electrodes 12a to 12d, movable electrodes 13a to 13d, trenches 14a and 14b, insulating materials 15a to 15d. In addition, the semiconductor dynamic quantity sensor includes first fixed electrodes 16a to 16d, second fixed electrodes 17a to 17d, trenches 18a to 18d, insulating materials 19a to 19d, trenches 20a to 20d, insulating materials 21a to 21d, first fixed electrodes 22a to 22d, second fixed electrodes 23a to 23d, trenches 24a to 24d, insulating materials 25a to 25d, trenches 26a to 26d, and insulating materials 27a to 27d.

The beams 9 and 10 which support the mass portion 11 are held by the square frame portion 5 through the insulating materials 15a to 15d. On the other hand, the first fixed electrodes 16a to 16d and 22a to 22d and the second fixed electrodes 17a to 17d and 23a to 23d are held by the square frame portion 5 through the insulating materials 19a to 19d, 21a to 21d, 25a to 25d, and 27a to 27d. With the structure, the square frame portion 5, the mass portion 11 including the movable electrodes 12a to 12d and 13a to 13d, the first fixed electrodes and the second fixed electrodes are electrically insulated from each other and are mechanically held. As a result, owing to a dynamic quantity of an object to be measured, the mass portion 11 can be moved. An electrostatic capacitance between the first fixed electrode and the first movable electrode, and an electrostatic capacitance between the second fixed electrodes and the second movable electrodes are detected, whereby a movable amount thereof can be detected.

Japanese Patent Application Laid-Open No. 2000-286430 discloses a technology in which a silicon oxide film is formed in the interior of the formed trenches and a polysilicon film is further formed to be embedded in each of the trenches. In the document, there is a description that the combined use of polysilicon of low stress produces an effect of reducing the stress generated in the trenches as compared with the case where only the single silicon oxide film is embedded in the trenches.

DISCLOSURE OF THE INVENTION

In the above-mentioned conventional structures, insulating materials are provided among a plurality of regions electrically insulated from each other, thereby holding the plurality of regions each other. Accordingly, a positional relationship among the plurality of regions is susceptible to an internal stress of the insulating material. In addition, coefficients of thermal expansion of the insulating material and of a substrate member sandwiching the insulating material are different from each other, so that the stress is liable to occur between the substrate member and the insulating material. As a result, the structure is also susceptible to a change in stress caused in the materials due to a change in ambient temperature. In a case of applying a high voltage, it is necessary to make the insulating material thicker so as to increase a dielectric voltage. However, as the insulating material is made thicker, the structure is more susceptible to the stress due to the internal stress of the insulating material and due to a difference in coefficient of thermal expansion among the materials.

Further, through holes or trenches may be formed in a substrate member, and an insulating material is embedded in the through holes or trenches, whereby the above-mentioned structure can be achieved. However, it is difficult to make the embedded insulating material films uniform in some cases. Further, it is necessary to increase the width of the trenches or the through holes in some cases so as to embed the insulating films therein. In this case, the structure is liable to be affected by the stress of the insulating material embedded. In addition, depending on a depth position of the through holes or the trenches, there is a possibility that the state of the insulating material formed is changed and a distribution of the stress is distributed. Meanwhile, there is a method involving embedding various kinds of insulating materials including an insulating material of low stress in the through holes or the trenches. However, in the method, it is necessary to make the width of the through holes larger, or a production process thereof becomes complicated in some cases.

When the above-mentioned stress is generated in the microstructural member, the beams and the mass member themselves are deformed, and the mechanical characteristics are changed, thereby fluctuating a drive characteristic of an actuator and a detection sensitivity characteristic of a sensor. In addition, an interval between electrodes may be changed due to the deformation of the beam, the mass member itself, and comb electrodes. Accordingly, there is a possibility that a driving force to be applied to the microstructural member is largely shifted from a desired one, or measurement precision in the movable amount of the microstructural member is lowered. As a result, those problems cause degradation of a drive performance of the actuator and a detection performance of the sensor.

In view of the above-mentioned problems, the present invention provides a structural member comprising a plurality of conductive regions electrically insulated from each other which is characterized in that the plurality of conductive regions are electrically insulated from each other by continuous oxidized regions; and the oxidized regions are each formed of an oxide made of a material having a plurality of through holes or trenches formed therein.

Further, in view of the above-mentioned problems, the present invention provides a method of producing a structural member having a plurality of conductive regions electrically insulated from each other which is characterized in that the method includes the following two steps. In the first step, a plurality of through holes or trenches is formed so as to be arranged at intervals on a base material. In the second step, the base material on at least the internal surface of the plurality of through holes or trenches is thermally oxidized so as to form continuous oxidized regions including the plurality of through holes or trenches, thereby forming the plurality of conductive regions, which are electrically insulated from each other, on the base material.

Further, in view of the above-mentioned problems, the present invention provides an acceleration sensor comprising the structural member, in which the structural member comprises a movable member for sensing an acceleration velocity. Further, in view of the above-mentioned problems, the present invention provides a gyroscope comprising the structural member, in which the structural member comprises a movable member for sensing an angular velocity.

Further, the present invention provides an actuator comprising the structural member, in which the structural member comprises a movable member for converting an input force of electric energy into physical motion. Further, the present invention provides an electric potential sensor comprising the structural member, in which the structural member comprises a movable member having a detection electrode portion for outputting an electrical signal according to a potential of an object to be measured.

As described above, in the structural member according to the present invention, the plurality of conductive regions are insulated from each other by oxidized regions continuously formed, and the oxidized regions are each made of an oxide of a material having a plurality of through holes or trenches formed therein. Accordingly, there can be provided, with a simple structure, a structural member having a plurality of regions electrically insulated from each other, in which the oxidized regions forming insulating portions can be reduced to a relatively small quantity, and stress is hardly generated in the oxidized regions. Further, in a method of producing the structural member, at least a base material constituting an internal surface of the plurality of through holes or trenches is subjected to thermal oxidation so as to form continuous oxidized regions, thereby facilitating the production thereof. Further, in the case of forming the oxidized regions, it is unnecessary to physically divide a substrate on which the structural member is formed by etching, cutting, or the like. Accordingly, insulation treatment can be performed without largely impairing the strength of the substrate and the processing accuracy. In addition, in devices using the structural member of the present invention in which the stress is hardly generated, performances such as the detection sensitivity and the drive characteristic can be improved.

BRIEF DESCRIPTION OF THE DRAWINGS

FIGS. 3-2A and 3-2B are cross-sectional diagrams for illustrating the process of producing the actuator according to the first embodiment of the present invention.

FIGS. 3-3A and 3-3B are cross-sectional diagrams for illustrating the process of producing the actuator according to the first embodiment of the present invention.

FIGS. 3-4A and 3-4B are cross-sectional diagrams for illustrating the process of producing the actuator according to the first embodiment of the present invention.

FIGS. 3-5A and 3-5B are cross-sectional diagrams for illustrating the process of producing the actuator according to the first embodiment of the present invention.

FIGS. 4A, 4B, and 4C are diagrams for illustrating a thermal oxidation process at the time of production of the actuator according to the first embodiment of the present invention.

FIG. 5-1 is a cross-sectional diagram for illustrating a process of producing an actuator according to a second embodiment of the present invention.

FIGS. 5-2A and 5-2B are cross-sectional diagrams for illustrating the process of producing the actuator according to the second embodiment of the present invention.

FIGS. 5-3A and 5-3B are cross-sectional diagrams for illustrating the process of producing the actuator according to the second embodiment of the present invention.

FIGS. 5-4A and 5-4B are cross-sectional diagrams for illustrating the process of producing the actuator according to the second embodiment of the present invention.

FIGS. 5-5A and 5-5B are cross-sectional diagrams for illustrating the process of producing the actuator according to the second embodiment of the present invention.

FIG. 6-1 is a cross-sectional diagram for illustrating a process of producing an actuator according to a third embodiment of the present invention.

FIGS. 6-2A and 6-2B are cross-sectional diagrams for illustrating the process of producing the actuator according to the third embodiment of the present invention.

FIGS. 6-3A and 6-3B are cross-sectional diagrams for illustrating the process of producing the actuator according to the third embodiment of the present invention.

FIGS. 6-4A and 6-4B are cross-sectional diagrams for illustrating the process of producing the actuator according to the third embodiment of the present invention.

FIGS. 6-5A and 6-5B are cross-sectional diagrams for illustrating the process of producing the actuator according to the third embodiment of the present invention.

FIGS. 6-6A and 6-6B are cross-sectional diagrams for illustrating the process of producing the actuator according to the third embodiment of the present invention.

FIGS. 6-7A and 6-7B are cross-sectional diagrams for illustrating the process of producing the actuator according to the third embodiment of the present invention.

FIGS. 6-8A and 6-8B are cross-sectional diagrams for illustrating the process of producing the actuator according to the third embodiment of the present invention.

FIGS. 7-1A, 7-1B, 7-1C, 7-1D, 7-1E, 7-1F, and 7-1G are plan diagrams for illustrating various examples of cross-sectional shapes and arrangement of through holes according to a fourth embodiment of the present invention, and are also cross-sectional diagrams of through holes according to a fifth embodiment of the present invention.

FIGS. 7-2A and 7-2B are cross-sectional diagrams for illustrating a structural member according to the fifth embodiment of the present invention.

FIG. 8 is a perspective view of a feedback (FB)-type acceleration sensor according to a seventh embodiment of the present invention.

BEST MODE FOR CARRYING OUT THE INVENTION

Hereinafter, embodiments of the present invention will be described with reference to the drawings.

First Embodiment

Figure 1:
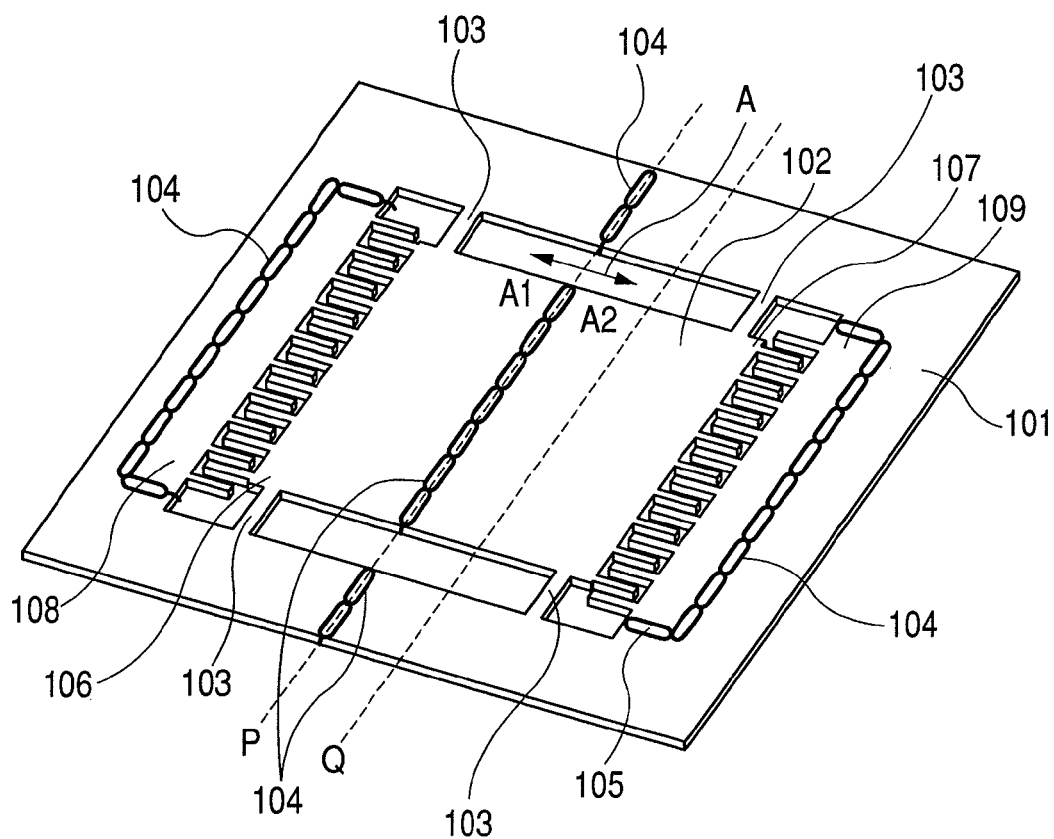
FIG. 1 is a perspective view of an actuator according to a first embodiment of the present invention.

A first embodiment of the present invention will be described with reference to FIGS. 1, 2A, 2B, 2C, 3-1A to 3-5B, 4A, 4B, and 4C. The first embodiment of the present invention relates to an actuator (mechanism for converting a force of input electric energy into physical motion) including a structural member having a plurality of conductive regions electrically insulated from each other, and to a method of producing the actuator. FIG. 1 is a perspective view of the actuator according to the first embodiment of the present invention. As illustrated in FIG. 1, the actuator includes a substrate 101 of conductive silicon or the like, a movable member 102, beams 103, thermally oxidized films 104 (oxidized regions), through holes 105, a first movable electrode 106, a second movable electrode 107, a first fixed electrode 108, and a second fixed electrode 109.

The substrate 101 is a base material on which the movable member 102, the beams 103, the fixed electrodes 108 and 109, and the like are formed. The through holes 105 are each formed in the thermally oxidized films (oxidized regions) 104. Thus, the thermally oxidized films 104 form continuous oxidized regions. In this structure, any path from one of conductive regions, which sandwich the thermally oxidized films 104, does not reach the other of the conductive regions without passing through a portion of the thermally oxidized films 104. In other words, joining areas between conductive regions are completely occupied by the thermally oxidized films 104 of the oxidized regions, so that the conductive regions, which sandwich the thermally oxidized films 104, are electrically insulated from each other. The thermally oxidized films 104 are each formed of an oxide made of a material (above-mentioned base material) having a plurality of through holes 105 formed therein. In addition, the first movable electrode 106 and the first fixed electrode 108 have comb teeth portions that are opposed to each other with a distance. The second movable electrode 107 and the second fixed electrode 109 also have comb teeth portions that are opposed to each other in a similar manner.

In the above-mentioned structure, the first movable electrode 106, the second movable electrode 107, the first fixed electrode 108, and the second fixed electrode 109 are electrically insulated from each other by the thermally oxidized films 104. The actuator according to the first embodiment of the present invention is characterized in that the thermally oxidized films 104 have a plurality of through holes 105. According to a formation pattern of the thermally oxidized films 104 illustrated in FIG. 1, the first movable electrode 106 is electrically connected to a left-half portion (left-hand electrode) of the substrate 101 excluding the first fixed electrode 108 through the beams 103. The second movable electrode 107 is electrically connected to a right-half portion (right-hand electrode) of the substrate 101 excluding the second fixed electrode 109 through the beams 103.

Figure 2A:
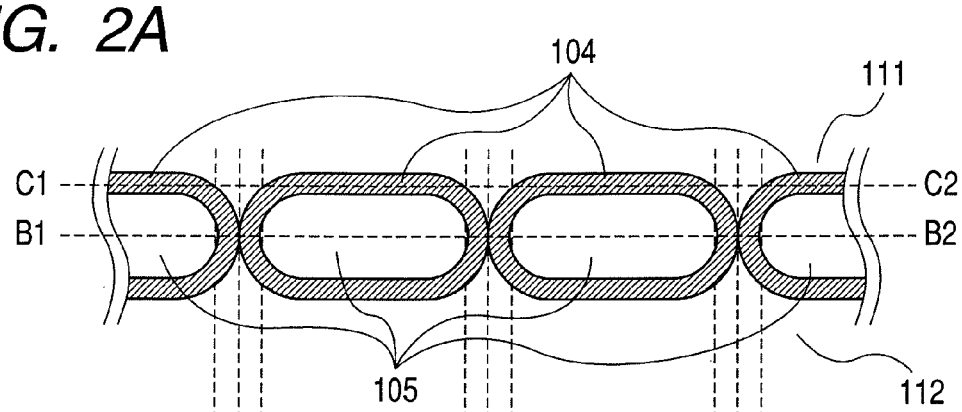
FIGS. 2A, 2B, and 2C are diagrams for illustrating an insulating portion of an oxidized region according to the first embodiment of the present invention.
Figure 2B:
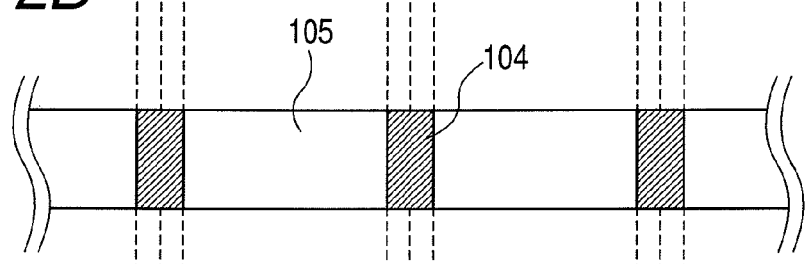
Figure 2C:
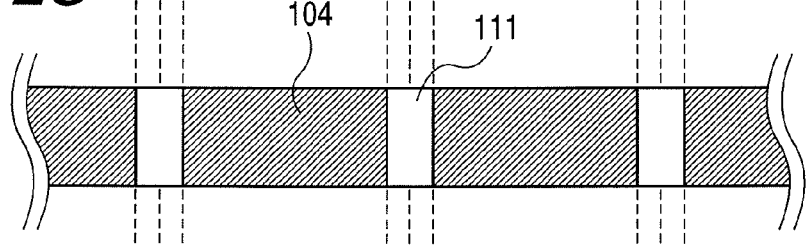

FIGS. 2A, 2B, and 2C are partially enlarged diagrams of the thermally oxidized films 104 having the through holes 105. FIG. 2A is a top view of the substrate, FIG. 2B is a cross-sectional diagram of the substrate taken along the line B1-B2, and FIG. 2C is a cross-sectional diagram of the substrate taken along the line C1-C2. As illustrated in FIGS. 2A, 2B, and 2C, the substrate has a first region 111 and a second region 112. The first region 111 and the second region 112 are used as various regions depending on positions of the thermally oxidized films 104.

In FIGS. 2A, 2B, and 2C, the thermally oxidized films 104 are continuously formed so that the first region 111 and the second region 112 are electrically insulated from each other. Thus, the first region 111 and the second region 112 can be completely electrically insulated from each other. In this case, the thermally oxidized films 104 have the plurality of through holes 105, with the result that a volume or a thickness of an insulating material (thermally oxidized film) for connecting the first region 111 and the second region 112 can be minimized to be consistent with needed mechanical strength. Accordingly, it is possible to achieve a microstructural member having a structure in which the movable member 102 and the substrate 101 are more resistant to deformation due to an effect of stress of the thermally oxidized film, as compared with a structure of the related art in which an insulating film with no through hole is formed.

In the structure of FIG. 1, the movable member 102 is supported by the substrate 101 with two pairs of the beams 103 so as to be movable in directions indicated by arrows A1 and A2. Further, the movable member 102 includes the first movable electrode 106, the second movable electrode 107, and the thermally oxidized films 104 having the plurality of through holes 105. On the other hand, the substrate 101 includes the first fixed electrode 108, the second fixed electrode 109, the thermally oxidized films 104 having the through holes 105, the left-side electrode, and the right-side electrode. Wiring for connecting each of the first movable electrode 106 and the second movable electrode 107 to a control circuit can be carried out by wiring each of the left-side electrode and the right-side electrode of the substrate 101 from an outside via bonding wires or the like through the beams 103. Wiring for connecting each of the first fixed electrode 108 and the second fixed electrode 109 to the control circuit can be carried out by wiring each of the first fixed electrode 108 and the second fixed electrode 109 from the outside via bonding wires or the like, or by forming wiring for connecting each of the first fixed electrode 108 and the second fixed electrode 109 on the insulating film to be formed on an appropriate position on the substrate 101.

The first movable electrode 106, the second movable electrode 107, the first fixed electrode 108, and the second fixed electrode 109 are electrically insulated from each other. Accordingly, arbitrary different potentials can be applied to the respective electrodes. For this reason, when a potential difference is applied between the first movable electrode 106 and the first fixed electrode 108, an electrostatic attraction is generated between the first movable electrode 106 and the first fixed electrode 108, thereby enabling movement of the movable member 102 in the direction indicated by the arrow A1. In a similar manner, when a potential difference is applied between the second movable electrode 107 and the second fixed electrode 109, the electrostatic attraction is generated between the second movable electrode 107 and the second fixed electrode 109, thereby enabling movement of the movable member 102 in the direction indicated by the arrow A2. The application of the potential difference between the first movable electrode 106 and the first fixed electrode 108, and the application of the potential difference between the second movable electrode 107 and the second fixed electrode 109 are performed alternately, thereby enabling oscillation of the movable member 102 with a desired cycle.

In the structure according to the first embodiment of the present invention, for the above-mentioned reasons, a positional relationship between the movable electrodes 106 and 107 and the fixed electrode 108 and 109, respectively, for generating the electrostatic attraction is hardly changed due to the effect of the stress. As a result, in the entire actuator, a uniform electrostatic attraction can be applied to the actuator. In addition, an effect of an external force applied to the beams 103 for supporting the movable members can be suppressed owing to the deformation of each of the movable member 102 and the formation of the substrate 101. Accordingly, mechanical characteristics of the actuator are hardly changed. For the above-mentioned reasons, it is possible to realize the actuator for permitting a drive operation with high precision.

Next, description is given of a method of producing the actuator according to the first embodiment of the present invention. The method includes a step of forming a plurality of through holes at intervals on the base material, and a step of performing thermal oxidation on the base material on at least an internal surface of each of the plurality of through holes so as to form continuous oxidized regions including the plurality of through holes, thereby forming a plurality of conductive regions, which are electrically insulated from each other, on the base material. FIGS. 3-1A to 3-5B are cross-sectional diagrams for illustrating the process of producing the actuator according to the first embodiment of the present invention. In FIGS. 3-1A to 3-5B, FIGS. 3-1A, 3-2A, 3-3A, 3-4A, and 3-5A each illustrate a cross section of a portion taken along the broken line P of FIG. 1, and FIGS. 3-1B, 3-2B, 3-3B, 3-4B, and 3-5B each illustrate a cross section of a portion taken along the broken line Q of FIG. 1. Note that, in FIGS. 3-1A, 3-2A, 3-3A, 3-4A, and 3-5A, in order to facilitate visualization, the number of through holes formed in the portion corresponding to the movable member 102 is reduced and the formation of the oxidized region in the portion corresponding to the substrate 101 is omitted. In FIGS. 3-1A to 3-5B, numeral 201 denotes a silicon 201 which is a base material on which a substrate, a movable member, and the like are formed, 202 a resist, 203 a mask material, 204 thermally oxidized films, and 210 through holes in oxidized regions.

Figures 1A, 3:
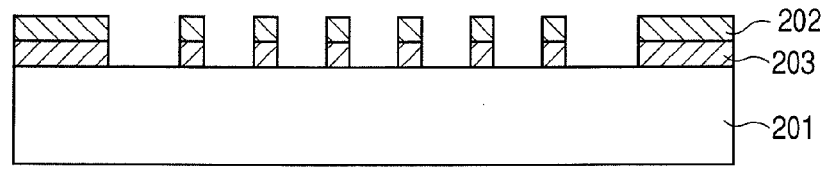
FIGS. 3-1A and 3-1B are cross-sectional diagrams for illustrating a process of producing the actuator according to the first embodiment of the present invention.
Figures 1B, 3:
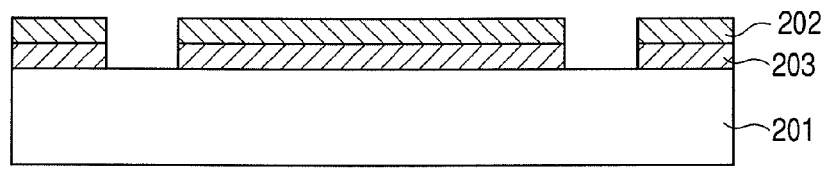
Figures 2A, 3:
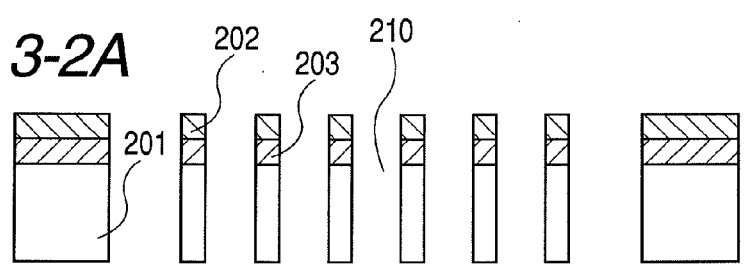
Figures 2B, 3:
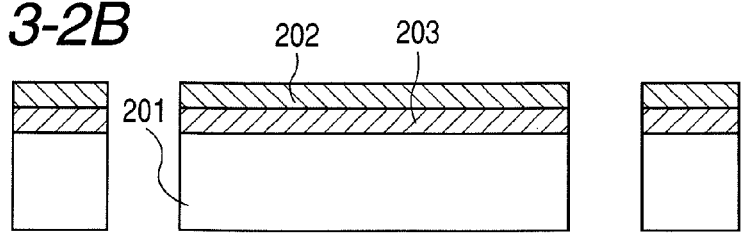

First, as illustrated in FIGS. 3-1A and 3-1B, the mask material 203 is deposited on one surface of the silicon substrate 201, the resist 202 is applied thereto, and then the resist 202 is patterned with an arbitrary pattern. Then, by use of a remaining resist pattern, the mask material 203 is selectively etched to be removed. Portions obtained by removing the mask material correspond to portions in which the through holes made of silicon are to be formed in a subsequent dry etching process. Specifically, removable of the portions corresponding to the through holes 210 of the oxidized regions and removal of the portions which are unnecessary for forming the structural member (movable members, beams, movable electrodes, fixed electrodes, and support substrate) are performed at the same time. In this case, as the mask material 203, materials, for example, metal such as aluminum (Al), silicon nitride, silicon oxide, and polysilicon can be used. Note that the mask material is not limited thereto, but any material can be used as long as the material can be tolerated when used as a mask material in a subsequent anisotropic etching process. The pattern of the resist 202 may be removed or may be used as a mask in the subsequent dry etching process. In this case, deposition and etching of another mask material are not indispensable.

Then, as illustrated in FIGS. 3-2A and 3-2B, the surface of the substrate on which the mask 203 is formed is subjected to anisotropic etching from portions thereof having no mask, thereby forming the through holes 210 in the substrate 201. In this case, as the anisotropic etching, dry etching, for example, Si Deep-RIE can be used.

Figures 3, 3A:
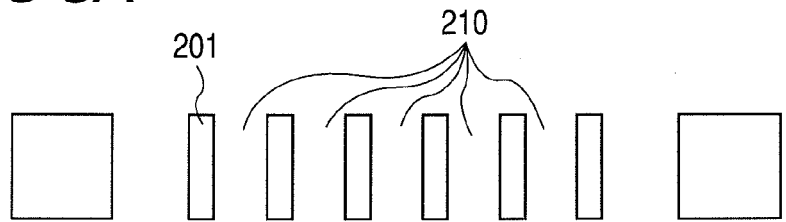
Figures 3, 3B:
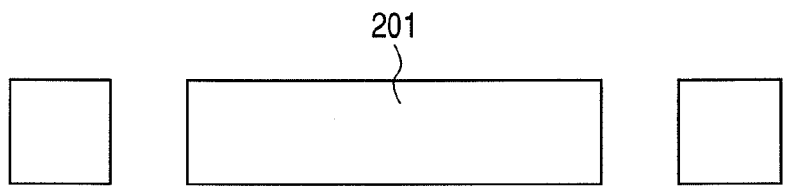

After the anisotropic etching, as illustrated in FIGS. 3-3A and 3-3B, the mask material 203, the resist 202, and the like are removed, and the surface of the silicon substrate 201 is cleaned.

Then, as illustrated in FIGS. 3-4A and 3-4B, the thermal oxidation is performed on the surface of the silicon. In the thermal oxidation process, the silicon is placed for a long period of time in an oxygen atmosphere of 1000° C. or higher, and silicon oxide is grown on the exposed silicon. The silicon oxide is grown not only on the surface of the silicon but also inside the surface while each oxidized region is increased from the surface of the silicon to the inside thereof (ratio between the former thickness and the latter thickness is about 55:45).

Figures 3, 4, 4A:
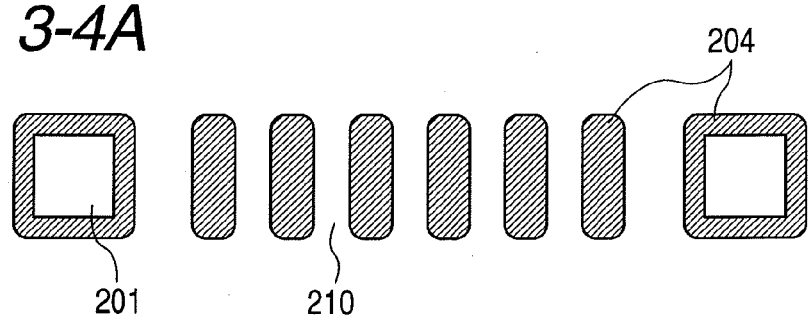
Figures 3, 4, 4B:
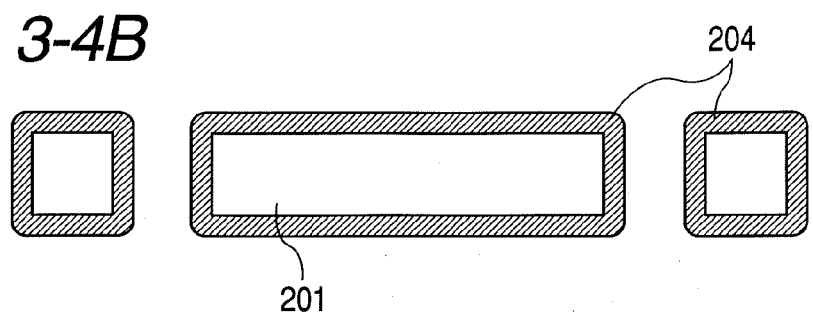
Figure 4A:
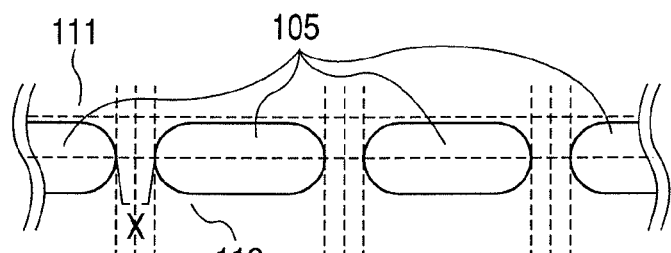
Figure 4B:
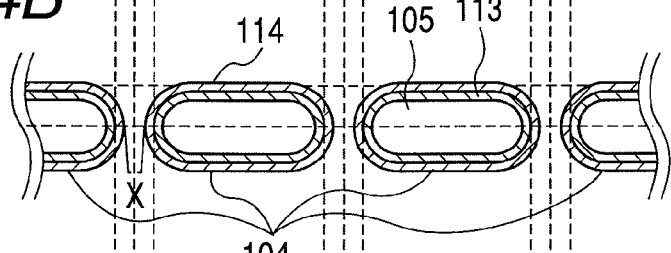
Figure 4C:
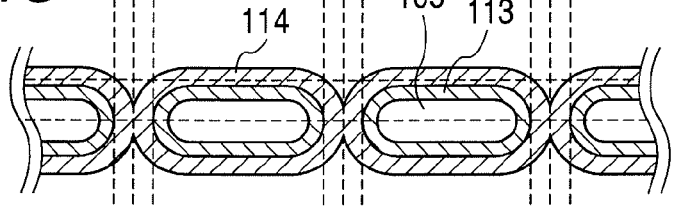
Figures 1, 5:
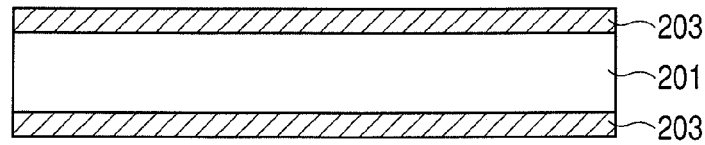
Figures 2A, 5:
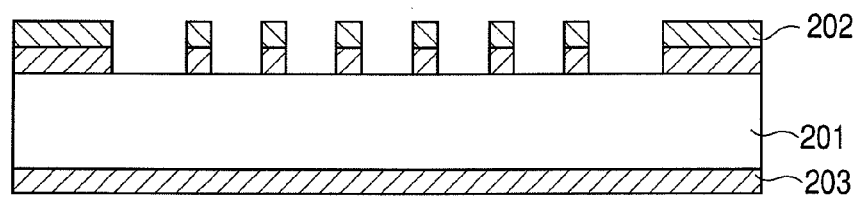
Figures 2B, 5:
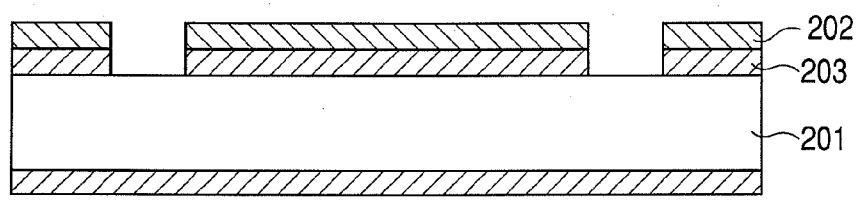
Figures 3A, 5:
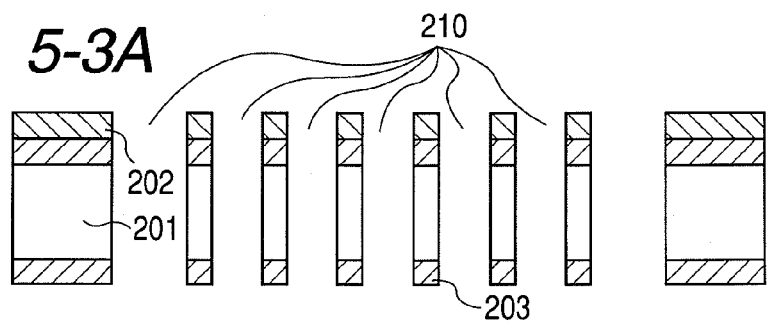
Figures 3B, 5:
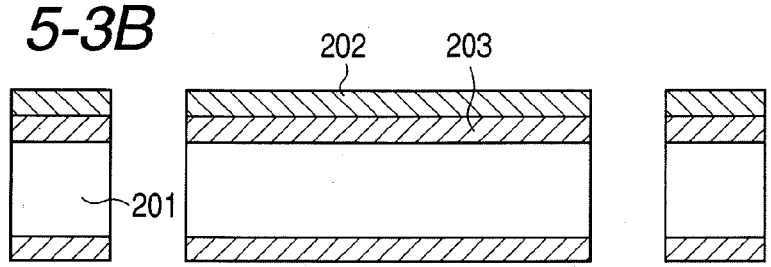
Figures 4A, 5:
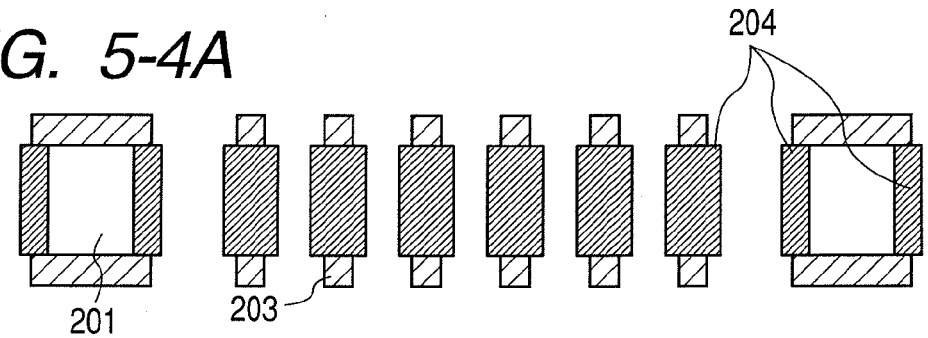
Figures 4B, 5:
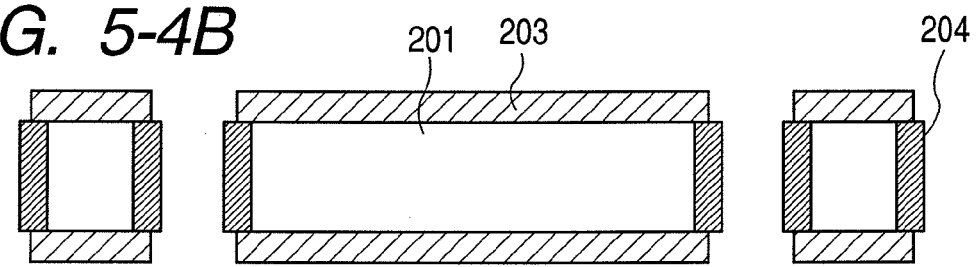
Figures 5, 5A:
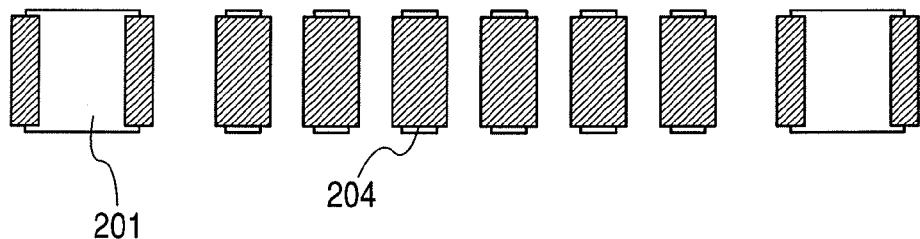
Figures 5, 5B:
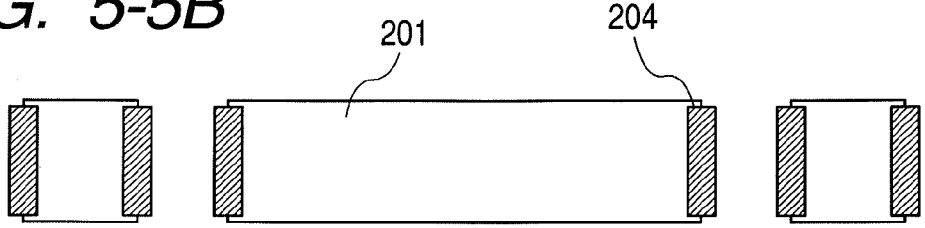

Here, description is given of the thermal oxidation process. FIGS. 4A, 4B, and 4C are top views of the substrate, for illustrating how the thermal oxidation process proceeds. As illustrated in FIGS. 4A, 4B, and 4C, the substrate includes the first region 111, the second region 112, thermally oxidized films 113 formed on the surface of the silicon, and thermally oxidized films 114 formed inside the silicon. First, a state of the substrate before being oxidized is illustrated in FIG. 4A.

In this case, portions between the through holes 105 are made of silicon (indicated as width X), so that the first region 111 and the second region 112 are not insulated from each other.

Then, a state of the substrate after being subjected to thermal oxidation for a half of a predetermined period of time is illustrated in FIG. 4B. In this case, the thermally oxidized films 113 are grown on the surface of the through holes 105, and the thermally oxidized films 114 are also grown inside the silicon, thereby narrowing the width X of the silicon formed between the adjacent through holes 105. As a result, the first region 111 and the second region 112 are insulated from each other to some extent.

Finally, a state of the substrate after being subjected to thermal oxidation for the predetermined period of time is illustrated in FIG. 4C. In this case, the thermally oxidized films 114 which are grown inside the silicon from the adjacent through holes 105 are in contact with each other to be integrated with each other. As a result, the first region 111 and the second region 112 are insulated from each other.

A relationship between the time for the thermal oxidation and the thickness of the thermally oxidized films 104 to be formed is a logarithmic functional relationship. In other words, when sufficient oxidation time is taken, the thickness of each of the thermally oxidized films 104 reaches saturation of a given value (about 1 μm to several μm). Accordingly, control of the thickness of each of the thermally oxidized films can be performed with higher precision. In addition, when a time for executing the actual production process is taken into consideration so that the silicon formed between the adjacent through holes 105 is completely oxidized to electrically insulate both the conductive regions from each other, the closest distance (width X in FIG. 4A) between the adjacent through holes 105 is desirably 2 μm or smaller.

On the other hand, in the anisotropic etching of the silicon, the thickness of the substrate (depth of through hole) is desirably about 100 μm or smaller. In other words, when the thickness of the substrate is about 100 μm or larger, in association with the inclination by the etching with respect to the substrate surface, thermal stress due to the asymmetry of shapes of the thermally oxidized films and the silicon causes deformation of structural member, which cannot be ignored.

As described above, through those processes, the plurality of conductive regions electrically insulated from each other can be formed. Specifically, after the plurality of through holes 105 are arranged to be close to each other, only the thermal oxidation is performed, thereby facilitating formation of the plurality of conductive regions electrically insulated from each other. Further, the formation of the plurality of through holes 105 can be performed simultaneously with the process of forming the movable member 102 and the beams 103. As a result, the structural member according to the first embodiment of the present invention can be produced without increasing the number of processes for silicon etching, in addition to the processes to be executed in the case of producing a simple structural member. Further, the mask used for producing the structural member can be shared, thereby suppressing an increase in the number of masks for silicon etching.

The thermally oxidized films 104 can be formed in only a small gap as long as oxygen is supplied thereto. Accordingly, the interval between the electrically insulated regions can be narrowed, and the effect of the stress of the insulating material (thermally oxidized film) of the oxidized region can be minimized. In addition, in the first embodiment of the present invention, each material formed between the adjacent through holes 105 is thermally oxidized, thereby performing insulation, which makes it unnecessary to implant an insulating material in each of the through holes as in the conventional method. Therefore, it is possible to prevent a problem such as internal stress in association of the insulating material.

Further, the actuator can be produced by use of only a single silicon substrate, so that a special substrate such as an SOI substrate is not necessarily used.

Further, conventionally, in a case of using a single silicon substrate instead of using an SOI substrate, the silicon residing under the movable member is removed by etching, so that the precision in thickness of the movable member cannot be increased to a great extent. On the other hand, in the first embodiment of the present invention, the thickness of the movable member 102 is determined by using the thickness of the silicon substrate, so that higher precision in thickness can be realized.

Finally, after the processes of FIGS. 3-4A and 3-4B, as illustrated in FIGS. 3-5A and 3-5B, the silicon oxide films formed on the surface of the silicon substrate 201 may be removed by the use of the dry etching from both surfaces of the substrate. As a result, the thermally oxidized films formed on top and bottom surfaces of the substrate are removed, thereby further reducing the stress of the thermally oxidized film. Note that the thermally oxidized films illustrated in FIG. 3-5B are not functionally necessary but are inevitably formed in the production process. There is no harm if the thermally oxidized films are left.

Further, when the width of each of the through holes 105 is small, there is a possibility that, finally, the through holes 105 are almost entirely embedded with the thermally oxidized films 113. However, the continuous oxidized regions including the through holes or trenches according to the present invention include such forms. Note that, in order to prevent the problem such as the internal stress, it is desirable that an amount of the oxide in the oxidized regions be as small as possible as long as a function of insulation is fulfilled. For this reason, the through holes 105 have usually a width equal to or larger than several times the thickness of the oxidized film.

Second Embodiment

Next, a second embodiment of the present invention will be described with reference to FIGS. 5-1 to 5-5B. The second embodiment is different from the first embodiment in the process of producing the actuator. Other structures thereof are substantially the same as those of the first embodiment.

Figures 3, 4, 5, 5A:
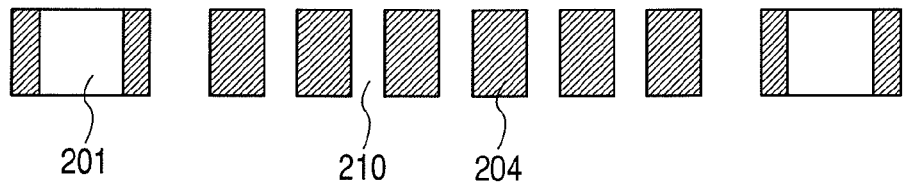
Figures 3, 4, 5, 5B:
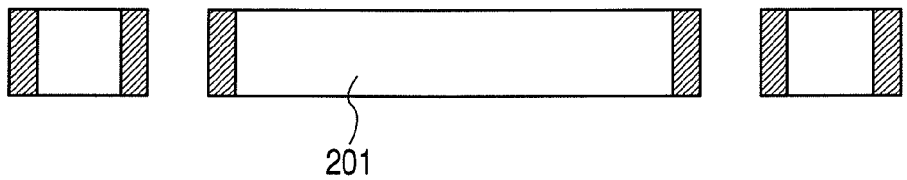

FIGS. 5-1 to 5-5B are cross-sectional diagrams for illustrating the process of producing the actuator according to the second embodiment of the present invention. Also in FIGS. 5-1 to 5-5B, numeral 201 denotes the silicon, 202 the resist, 203 the mask material, 204 the thermally oxidized film, and 210 the through hole of the oxidized regions. In FIGS. 5-2A to 5-5B, the same components are defined or omitted in the same manner as in FIGS. 3-1A to 3-5B.

In the second embodiment of the present invention, as illustrated in FIG. 5-1, there is used a substrate (base material) obtained by forming the mask material 203 on both surfaces of the silicon substrate 201. First, the resist 202 is applied onto the substrate, and one surface thereof is patterned with an arbitrary pattern. A state of the substrate obtained after the mask material 203 is selectively etched by the use of the remaining resist pattern is illustrated in FIGS. 5-2A and 5-2B.

Then, the mask material 203 is used as an etching mask, and the silicon 201 is subjected to dry etching, thereby forming the through holes 210. After that, as illustrated in FIGS.

5-3A and 5-3B, the mask material 203 formed on the back surface is also etched in the same shape as the pattern of the through holes 210.

Then, the resist 202 is removed, thereby cleaning the substrate. After that, as illustrated in FIGS. 5-4A and 5-4B, in an oxygen atmosphere at high temperature, the silicon 201 is subjected to thermal oxidation. In this case, portions of both surfaces of the substrate, on which the mask material 203 is formed, are not thermally oxidized, and the thermally oxidized films 204 are formed only on the portions of the silicon, which are exposed in the previous dry etching process.

Finally, as illustrated in FIGS. 5-5A and 5-5B, the mask material 203 is removed by etching.

According to the second embodiment of the present invention, regions in which the mask material 203 is formed are thermally oxidized. As a result, in the thermal oxidation process illustrated in FIGS. 5-4A and 5-4B in which the insulation is performed, the structure is more hardly deformed by the stress of the thermally oxidized film.

As the mask material 203 in the second embodiment of the present invention, any material can be used as long as the material can withstand the temperature in the thermal oxidation process. In particular, silicon nitride is suitably used. When silicon nitride is used, only the thermally oxidized silicon can be selectively left on the microstructural member.

As the mask material 203, silicon oxide can also be used. When the thickness of the silicon oxide used as the mask is large, during the thermal oxidation process illustrated in FIGS. 5-4A and 5-4B, the thickness of the silicon oxide used as the mask hardly changes. For this reason, the stress of the silicon oxide used as the mask material 203 hardly changes.

As described above, in the second embodiment of the present invention, during the process of forming the oxidized regions, prior to execution of the thermal oxidation process, the mask material such as silicon nitride is formed on the portions other than the internal surface of each through hole of the base material. Accordingly, there can be provided a production process capable of forming the microstructural member while reducing the stress generated on the surface of the substrate during the thermal oxidation process.

Third Embodiment

Next, a third embodiment of the present invention will be described with reference to FIGS. 6-1 to 6-8B. The third embodiment is different from the first embodiment in the process of producing the actuator. Excepting the process, the third embodiment is substantially the same as the first embodiment.

FIGS. 6-1 to 6-8B are cross-sectional diagrams for illustrating the process of producing the actuator according to the third embodiment of the present invention. In FIGS. 6-1 to 6-8B, numeral 201 denotes the silicon, 202 the resist, 203 the mask material, 204 the thermally oxidized film, 205 an oxidized film, 206 a second silicon substrate, 207 a protective film material, and 210 the through holes of the oxidized regions. In FIGS. 6-2A to 6-8B, the same components are defined or omitted in the same manner as in FIGS. 3-1A to 3-5B.

Figures 1, 6:
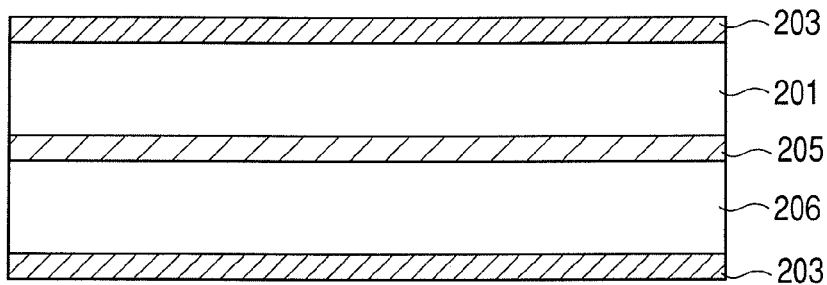
Figures 2A, 6:
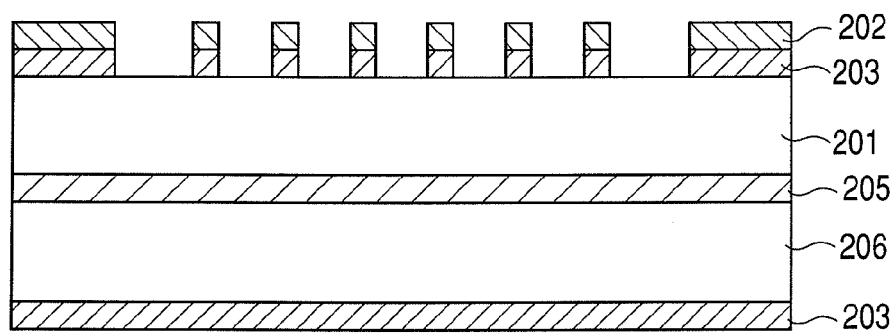
Figures 2B, 6:
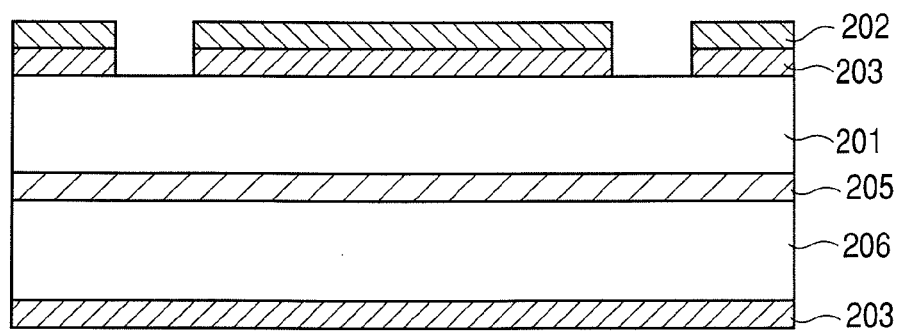
Figures 3A, 6:
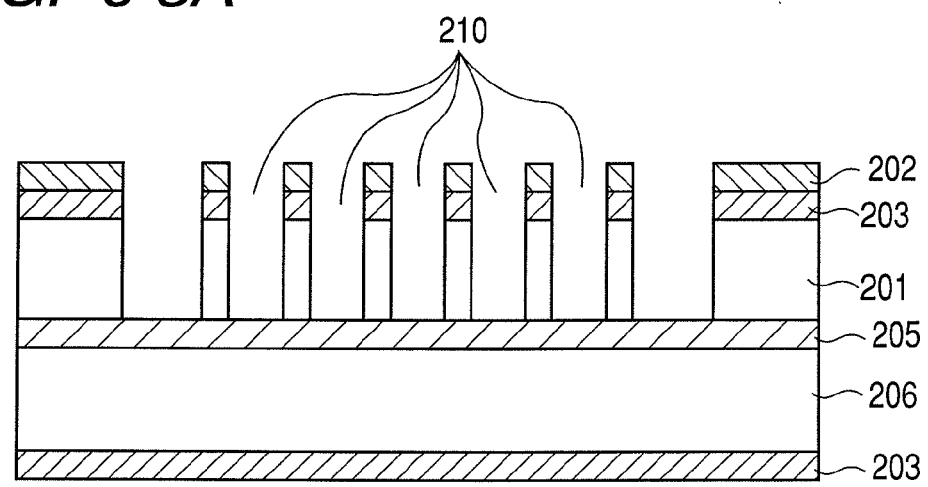
Figures 3B, 6:
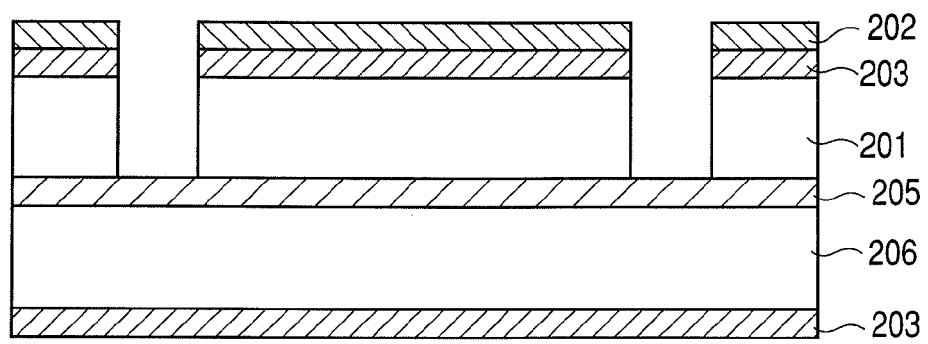
Figures 4A, 6:
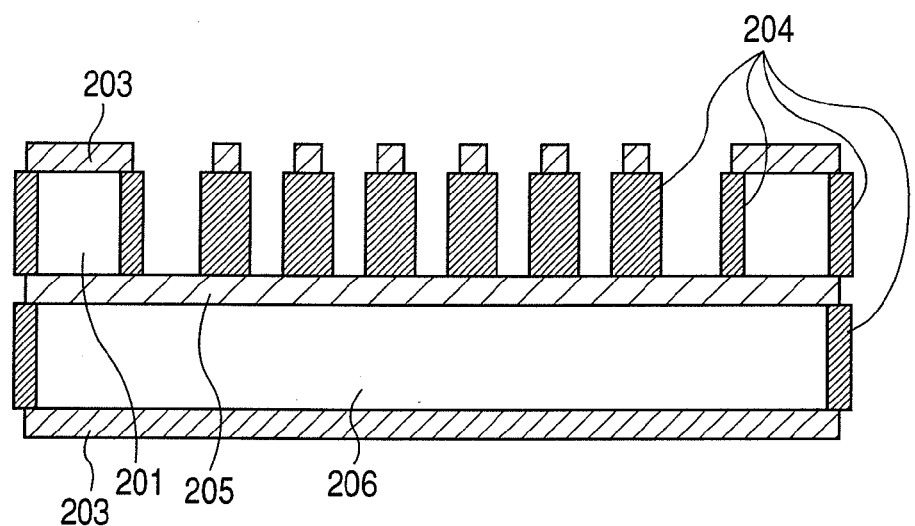
Figures 4B, 6:
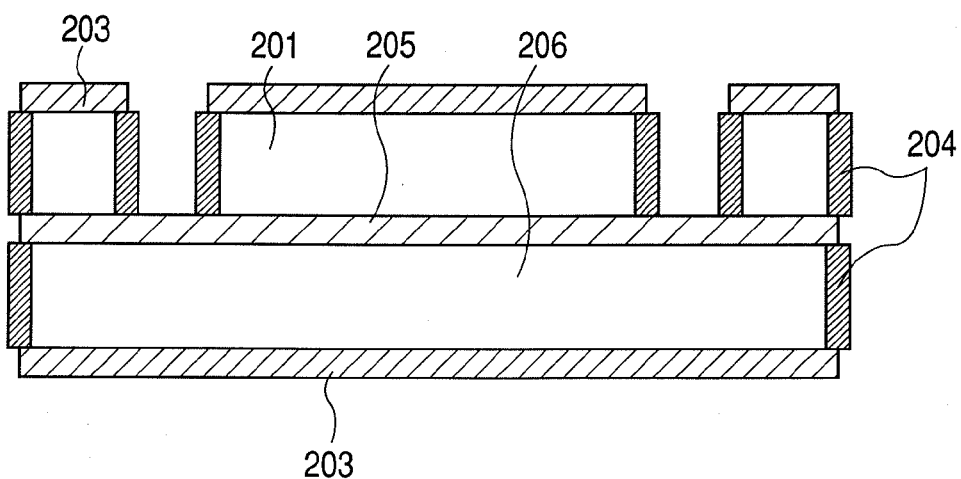
Figures 5A, 6:
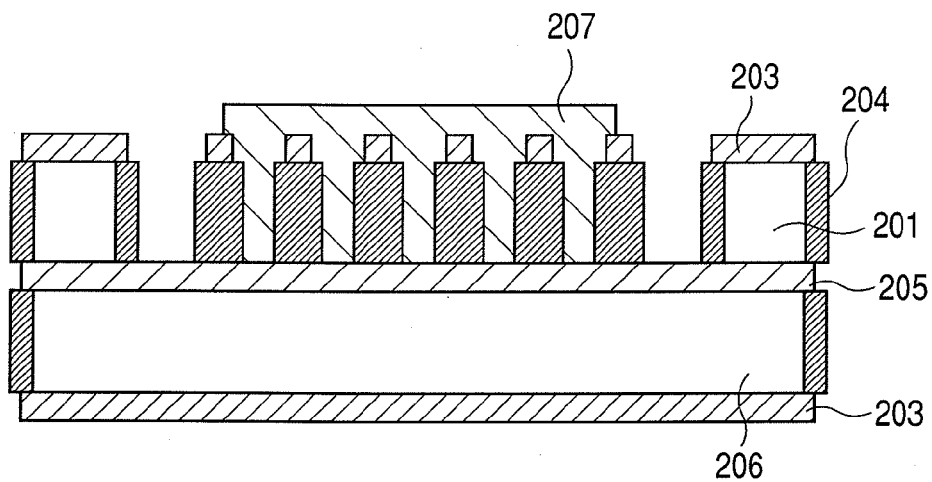
Figures 5B, 6:
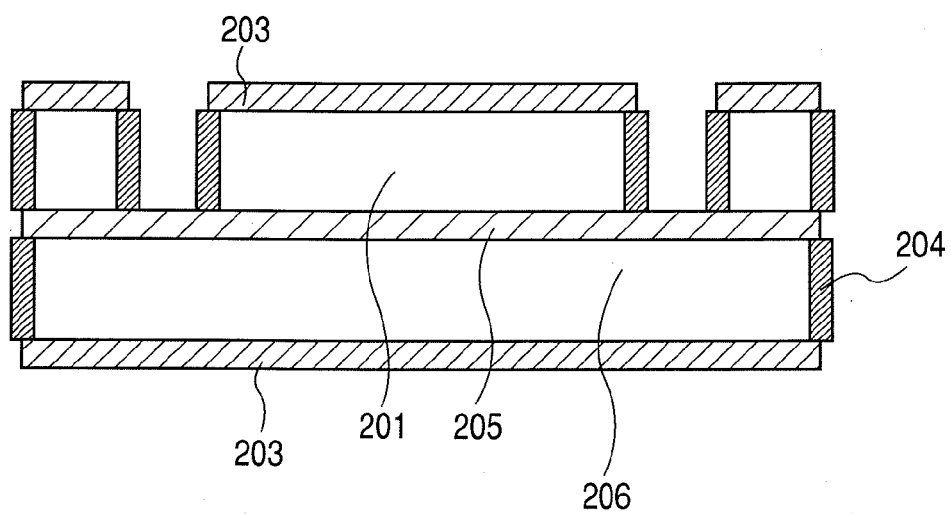
Figures 6, 6A:
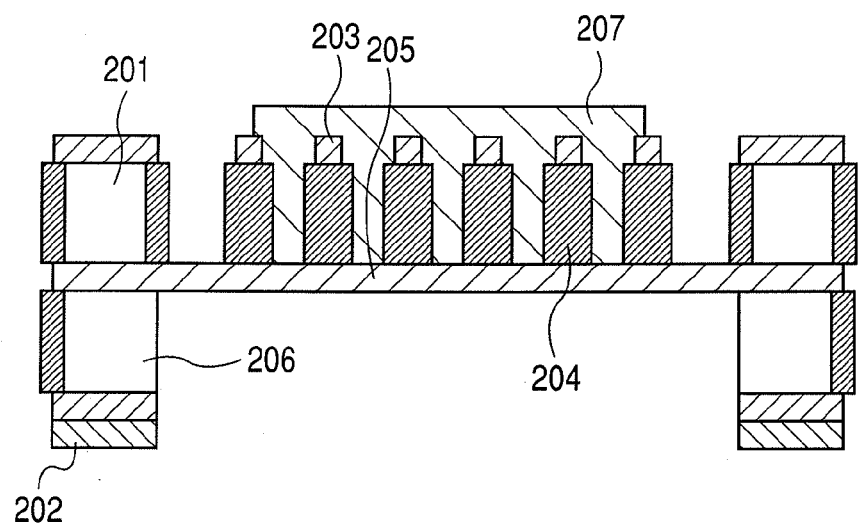
Figures 6, 6B:
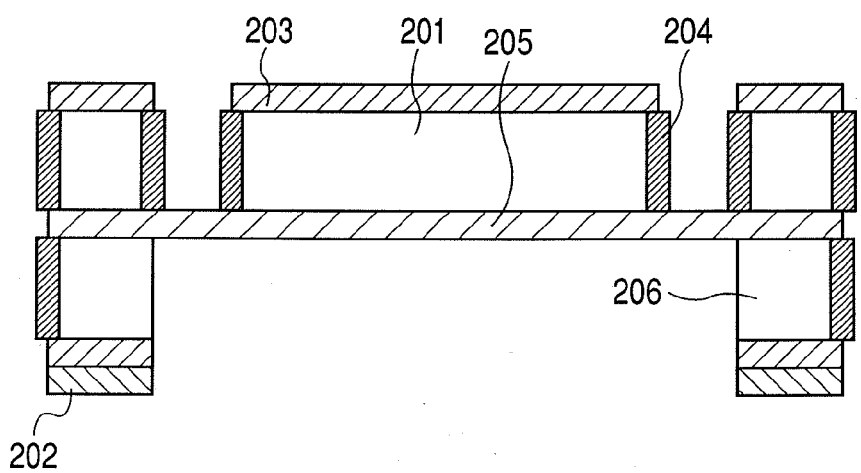

In the third embodiment of the present invention, a silicon-on-insulator (SOI) substrate (base material) is used in which the substrate 201 and the second silicon substrate 206 are joined with each other by using the oxidized film 205. FIG. 6-1 illustrates a state where the mask material 203 is formed on both surfaces of the SOI substrate.

First, as illustrated in FIGS. 6-2A and 6-2B, the mask material 203 is deposited on one surface of the SOI substrate, and the resist is applied thereto. Then, the resist 202 is patterned in an arbitrary pattern. By the use of the remaining resist pattern, the mask material 203 is selectively etched to be removed.

Next, as illustrated in FIGS. 6-3A and 6-3B, the substrate surface, on which the mask material 203 is formed, is subjected to the anisotropic etching from portions thereof having no mask, thereby forming the through holes 210 in the substrate 201. In this case, as the anisotropic etching, dry etching such as Si Deep-RIE can be used. After the anisotropic etching, the resist 202 is removed, and the surface of the silicon substrate is cleaned.

After that, as illustrated in FIGS. 6-4A and 6-4B, the surface of the silicon substrate is subjected to thermal oxidation. When the silicon substrate is placed for a long period of time in an oxygen atmosphere of 1,000° C. higher, the silicon oxide 204 is grown on an exposed side surface of the silicon substrate by the anisotropic etching.

Then, as illustrated in FIGS. 6-5A and 6-5B, a protective film 207 is formed on the surface subjected to the anisotropic etching, and the protective film 207 is left only in a region, in which the thermally oxidized films 204 are intended to be left, by patterning and etching. After that, as illustrated in FIGS. 6-6A and 6-8B, the silicon substrate 206 is etched from the back surface thereof with the arbitrary pattern.

Then, the silicon oxide is removed by etching. At this time, the exposed thermally oxidized films 204 and the oxidized film 205 of the SOI substrate are removed. As illustrated in FIGS. 6-7A and 6-7B, through adjustment of a time for etching, only the thermally oxidized films 204 in the desired regions can be left.

Finally, as illustrated in FIGS. 6-8A and 6-8B, the protective film 207 is removed. As a result, it is possible to form the microstructural member including a plurality of conductive regions electrically insulated from each other, while only insulating portions which are formed of the thermally oxidized films 204 are left.

As described above, in the third embodiment of the present invention using the SOI substrate having the oxidized film 205, only the thermally oxidized films (oxidized regions) necessary for electrically insulating the plurality of conductive regions from each other can be easily left with a more precise shape by using the protective film 207. As a result, mechanical characteristics and electrical insulating characteristics of the microstructural member are less affected by the shapes of the thermally oxidized films obtained after the etching.

Fourth Embodiment

A fourth embodiment of the present invention will be described. The fourth embodiment is different from the above embodiments in the formation of an outline of the structural member, formation of through holes in the insulating portions (oxidized regions), and the thermal oxidation process.

First, the following method can be employed. Formation of the outline of the structural member portion and formation of the through holes in the insulating portions are performed at the same time by etching. After that, the outline portion of the structural member may be covered with a protection material, and only side walls of the through holes may be thermally oxidized. As a result, the shape of the outline of the structural member is not changed in the thermal oxidation process. Accordingly, there can be provided the microstructural member with less variation in characteristics. In particular, in electrostatic comb teeth portions which can be used for driving the movable member and for detecting the displacement of the movable member, the distance between comb teeth has a large effect on a drive characteristic and a detection characteristic. For this reason, in the fourth embodiment of the present invention, an effective distance between the comb teeth is not increased by the thermal oxidation, so that deterioration of the drive characteristic and of the detection characteristic in the comb teeth portions can be suppressed.

In this case, the etching of only the structural member portion and protection with the protection material may be performed in advance, and then etching of the through holes in the insulating portions and insulation by thermal oxidation may be carried out.

Further, the following method may also be employed. After only etching of the through holes in the insulating portions is performed, the thermal oxidation process is then carried out, thereby performing insulation. Then, the portion of the outline of the structural member is etched again, thereby forming the structural member. As a result, the number of etching processes for silicon is increased, but the effective distance between the comb teeth portions is not increased by the thermal oxidation. Accordingly, deterioration of the drive characteristic and of the detection characteristic can be suppressed in the comb teeth portions. In addition, after the insulation is performed by the thermal oxidation, the structural member portion including comb electrodes is formed, whereby the comb electrodes can be arranged with higher precision than the case of executing the thermal oxidation after the formation of the comb electrodes.

Fifth Embodiment

In a fifth embodiment of the present invention, there are illustrated some examples of the structural member which are different from that of the above embodiments in shape and arrangement of the through holes. In the rest other than the shape and arrangement of the through holes, the fifth embodiment is the same as the first embodiment of the present invention.

Figures 6, 7, 7A:
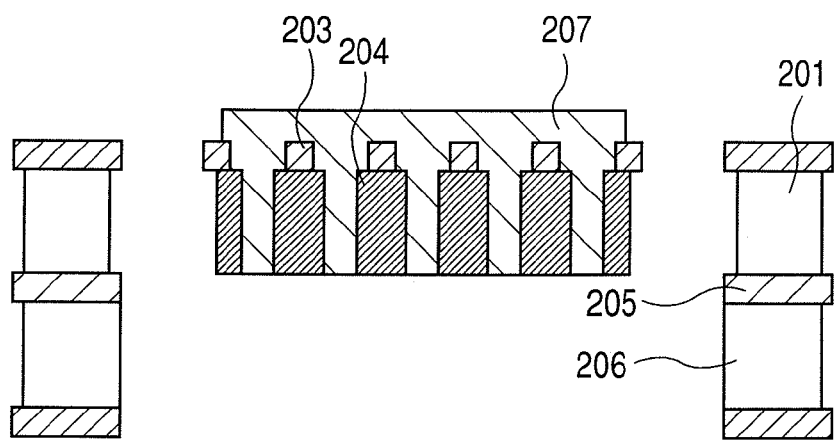
Figures 6, 7, 7B:
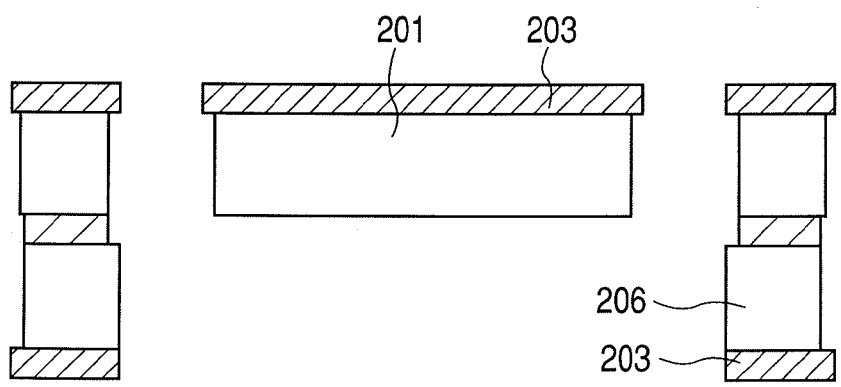
Figures 1A, 7:
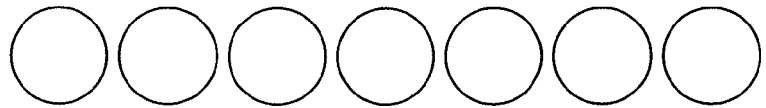
Figures 1B, 7:
Figures 1C, 7:
Figures 1D, 7:
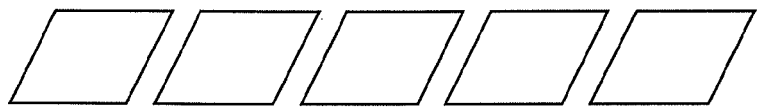
Figures 1E, 7:
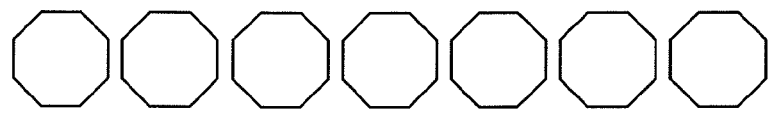
Figures 1F, 7:
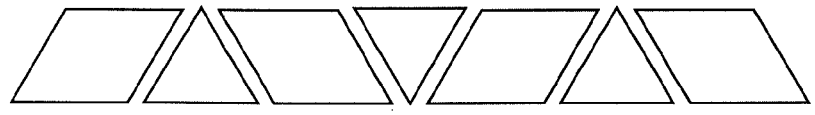
Figures 1G, 7:
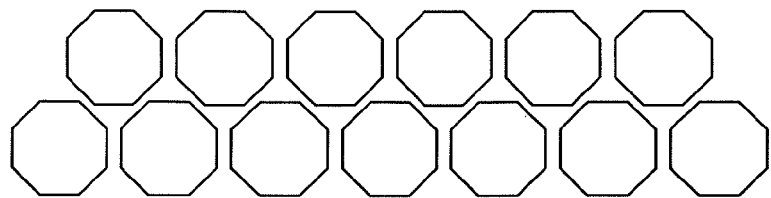
Figures 2A, 7:
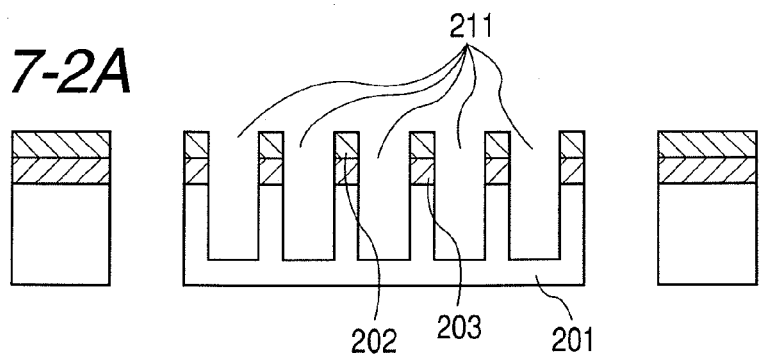
Figures 2B, 7:
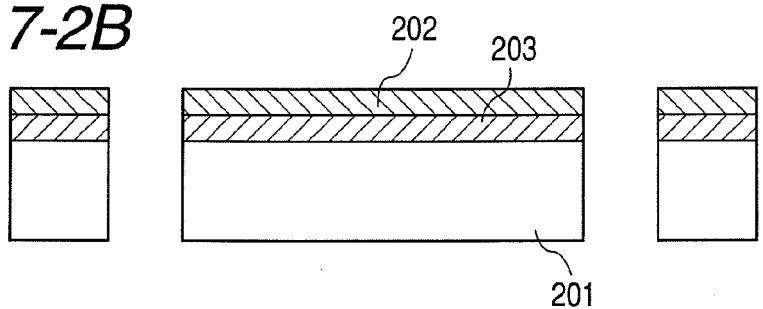
Figure 8:
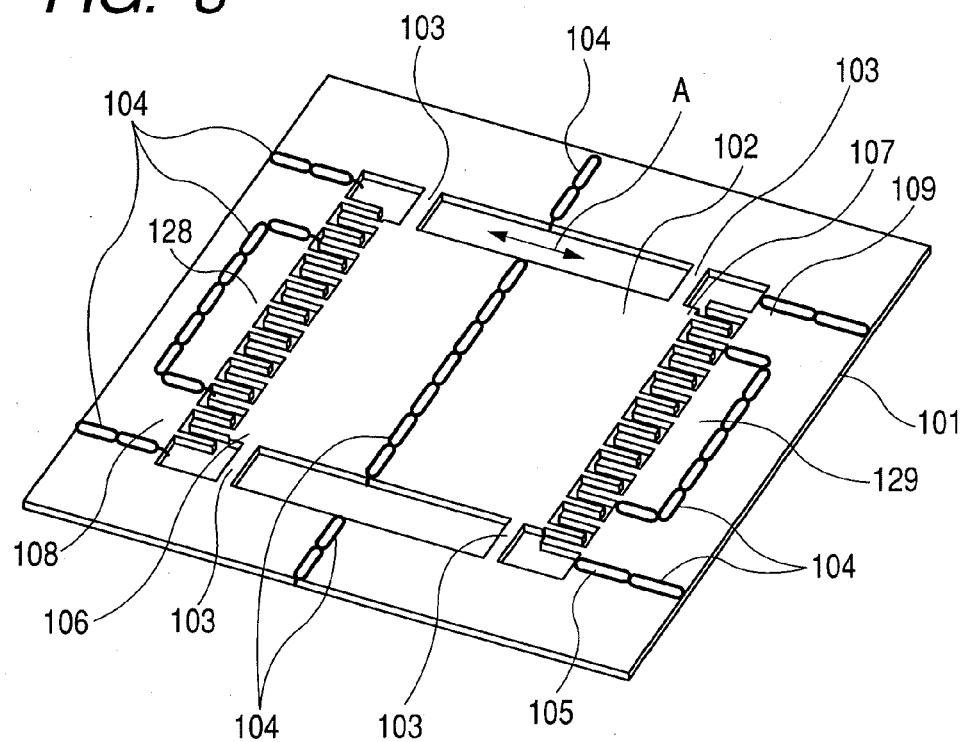

FIGS. 7-1A, 7-1B, 7-1C, 7-1D, 7-1E, 7-1F, and 7-1G are diagrams for illustrating cross-sectional shapes and arrangement of the through holes according to the fifth embodiment of the present invention. The shape of each through hole is not limited to that described in the first embodiment. A circle (example of FIG. 7-1A), an ellipse, a rectangle (example of FIG. 7-1B), a triangle (example of FIG. 7-1C), a square, a parallelogram (example of FIG. 7-1D), other polygonal shapes (example of FIG. 7-1E; octagon in this case), and the like can be used. In the example of FIG. 7-1C, triangular holes are alternately turned upside down so as to obtain a substantially constant width of the material formed in each gap between the holes. As illustrated in the example of FIG. 7-1F, through holes having different shapes may be combined to be arranged (in this case, holes having a triangular shape and holes having a parallelogram shape are alternately arranged while directions thereof are appropriately changed). Further, the through holes may be linearly arranged or may be arranged in a curved line, stepwise, or the like. Further, as illustrated in the example of FIG. 7-1G, the through holes may be arranged in a plurality of rows with positions of the gaps between the through holes in the respective rows being shifted from each other (that is, through holes may be alternately arranged in a staggered manner). As a matter of course, in any of the examples, it is necessary to set the width of the material formed in each gap between the holes so that the material is reliably oxidized in the oxidation process from the internal surface of each of the holes provided on both sides to a middle point of the material, to thereby obtain insulating portions.

The forms of the holes are appropriately selected for each case, whereby there can be provided the microstructural member in which the mechanical strength of the insulating portions is satisfactorily maintained while the effect of the stress of the thermally oxidized films is reduced.

Sixth Embodiment

FIGS. 7-2A and 7-2B are diagrams for illustrating a sixth embodiment of the present invention. FIGS. 7-2A and 7-2B are cross-sectional diagrams corresponding to FIGS. 3-2A and 3-2B of the first embodiment. As illustrated in FIGS. 7-2A and 7-2B of the sixth embodiment of the present invention, the holes may be replaced with trenches 211 which do not completely penetrate the substrate 201. In this case, the difference between the thickness of the substrate 201 and the depth of each of the trenches 211 (thickness of a material portion under the bottom surface of each trench) depends on the thickness of the thermally oxidized film to be formed in the interior of the silicon by the thermal oxidation process, and it is necessary to select an appropriate value as the difference. In a case of performing the thermal oxidation from both surfaces of the substrate 201, it is necessary to set the difference to be equal to or smaller than twice the thickness of the thermally oxidized film. In a case of performing the thermal oxidation only from one surface side of the substrate 201, it is necessary to set the difference to be equal to or smaller than the thickness of thermally oxidized film. For the reasons described in the first embodiment, those values are desirably set to be equal to or smaller than 2 μm (in the former case) or equal to or smaller than about 1 μm (in the latter case). For the same reasons described in the first embodiment, the depth of each trench is desirably set to be equal to or smaller than about 100 μm. In this manner, the plurality of holes in the oxidized regions of the structural member according to the present invention may be trenches. Further, the through holes and the trenches may be present in combination.

By the use of the above-mentioned forms, it becomes unnecessary to use the through holes, and limitations in design of the microstructural member are reduced, and the strength characteristic of the microstructural member can be easily improved.

Seventh Embodiment

Figures 6, 7, 8, 8A:
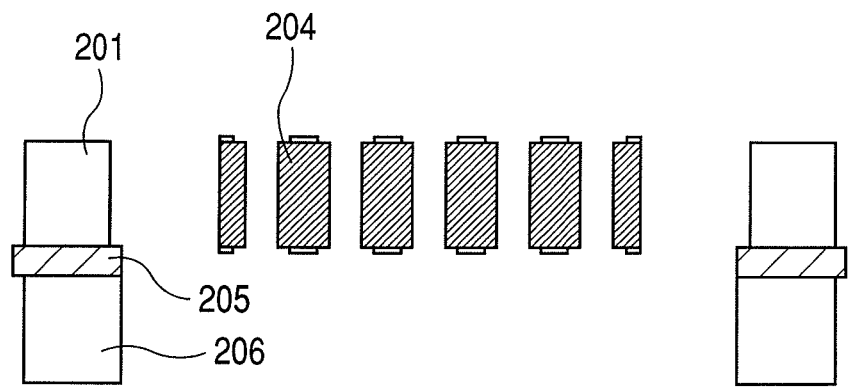
Figures 6, 7, 8, 8B:
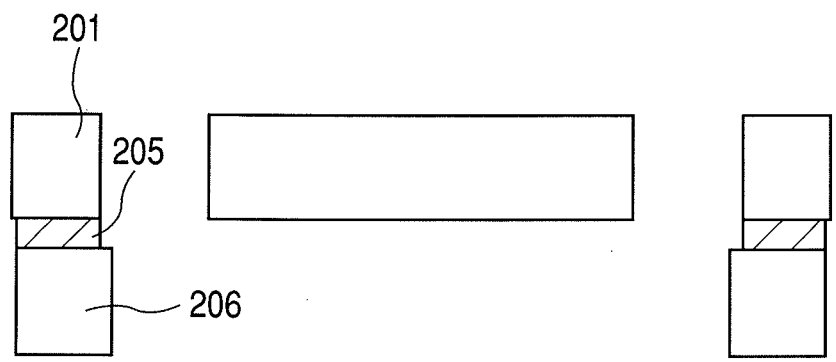

Next, with reference to FIG. 8, description is given of a feedback (FB)-type acceleration sensor according to a seventh embodiment of the present invention. The seventh embodiment is different from the above embodiments in that the structural member of the present invention is used not as the actuator but as the FB-type acceleration sensor.

In FIG. 8, the acceleration sensor includes the substrate 101, the movable member 102, the beams 103, the thermally oxidized films 104, the through holes 105, the first movable electrode 106, the second movable electrode 107, the first fixed electrode 108, the second fixed electrode 109, a third fixed electrode 128, and a fourth fixed electrode 129. The first fixed electrode 108, the second fixed electrode 109, the first movable electrode 106, the second movable electrode 107, the third fixed electrode 128, and the fourth fixed electrode 129 are each insulated from other electrodes by the method described in the above embodiments. Each of the electrodes is electrically connected to the control circuit via the movable member 102, the beams 103, and the like. As described above, wiring for connecting each of the third fixed electrode 128 and the fourth fixed electrode 129 to the control circuit is carried out by wiring each of the third fixed electrode 128 and the fourth fixed electrode 129 from the outside via bonding wires or the like, or by forming wiring for connecting each of the third fixed electrode 128 and the fourth fixed electrode 129 on the insulating film to be formed on an appropriate position on the substrate 101.

In the acceleration sensor according to the seventh embodiment of the present invention, the movable member 102 is held by the beams 103 each connected to the substrate 101. The movable member 102 has a structure in which it is easily moved only in directions indicated by arrows A. When an acceleration velocity is applied to the acceleration sensor according to the seventh embodiment of the present invention in the directions indicated by the arrows A, the movable member 102 is moved in any of the directions of the arrows A according to the magnitude of the acceleration velocity. In this case, an electrostatic capacitance between the first fixed electrode 108 and the first movable electrode 106, and an electrostatic capacitance between the second fixed electrode 109 and the second movable electrode 107 are changed according to a distance to which the movable member 102 is moved. At this time, there is a relationship that when one of the electrostatic capacitances is increased, the other electrostatic capacitance is reduced. The electrostatic capacitance becomes larger as the distance between electrodes is smaller. Accordingly, it is apparent that the movable member 102 is moved in the direction of a pair of electrodes having a larger electrostatic capacitance.

The acceleration sensor according to the seventh embodiment of the present invention includes a unit for detecting a motion of the movable member 102 and applying a force for cancelling the force of an acceleration velocity in a direction opposite to the force of the acceleration velocity. Specifically, a given potential is applied to one of the third fixed electrode 128 and the fourth fixed electrode 129. As a result, a potential difference is produced between the third fixed electrode 128 and the first movable electrode 106 or between the fourth fixed electrode 129 and the second movable electrode 107, and electrostatic attraction is generated between the electrodes between which the potential difference is produced.

In this manner, when a potential difference is produced between the movable electrode and the fixed electrode opposed to the movable electrode, the electrostatic attraction is generated between the pair of electrodes. On the other hand, when the potential difference is not produced between the movable electrode and the fixed electrode opposed to the movable electrode, the electrostatic attraction is not generated between the pair of electrodes. By using the fact, the acceleration sensor according to the seventh embodiment of the present invention is controlled such that the force for cancelling the detected acceleration force is constantly applied to the movable member 102.

In the acceleration sensor according to the seventh embodiment of the present invention, as described above, the acceleration velocity to be applied is constantly fed back to be cancelled, whereby the movable member 102 is prevented from being excessively moved even when a large acceleration velocity is applied thereto. Accordingly, the movable member 102 is prevented from being brought into contact with the comb electrodes and from damaging the comb electrodes. In addition, the magnitude of the force obtained when the acceleration is fed back and a balance is taken may be detected, thereby enabling the detection of acceleration velocity with higher precision. When the insulating structure of the present invention is applied to the acceleration sensor having the above-mentioned structure, a plurality of movable electrodes can be formed also on the movable member 102, thereby enabling more complicated detection control and more precise detection control to be achieved.

Further, the silicon substrate is processed, thereby easily forming electrostatic comb teeth portions also on a structural member having a large thickness. As a result, the efficiency in drive of the sensor and detection by the sensor is improved. In addition, the deformation of the microstructural member due to the stress of the insulating portions in the oxidized regions can be reduced. As a result, by the use of the structural member of the present invention including the movable member for sensing the acceleration velocity, an acceleration sensor of higher performance can be provided.

Eighth Embodiment

Figure 9:
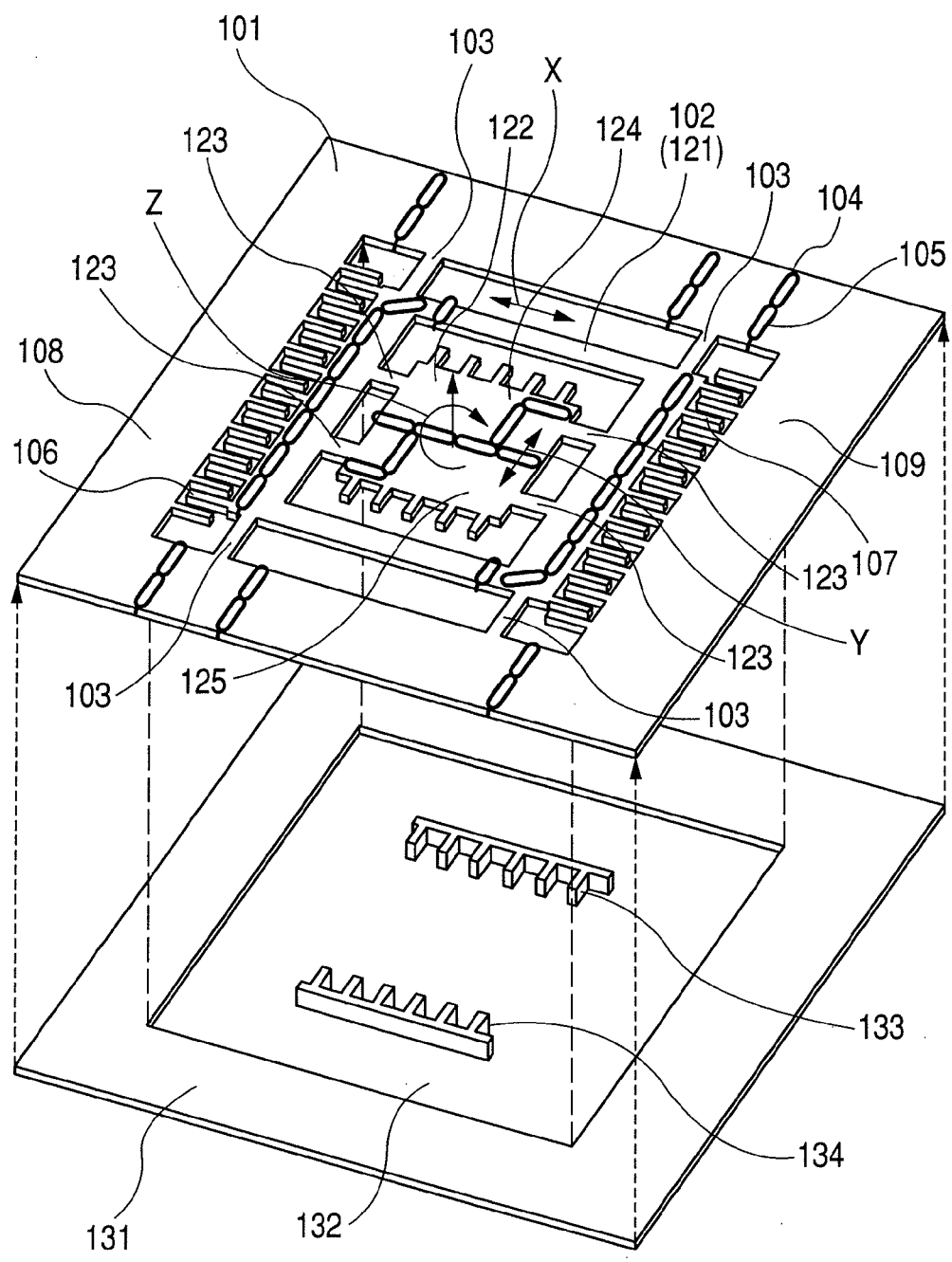
FIG. 9 is a perspective view of a frame-type gyroscope according to an eighth embodiment of the present invention.

With reference to FIG. 9, description is given of a frame-type gyroscope according to an eighth embodiment of the present invention. The eighth embodiment is different from the above embodiments in that the structural member of the present invention is applied to the frame-type gyroscope.

FIG. 9 is a perspective view illustrating a state of the frame-type gyroscope according to the eighth embodiment of the present invention, in which upper and lower substrates are made apart from each other. In FIG. 9, the gyroscope includes the substrate 101, the movable member 102, the beams 103, the thermally oxidized films 104, the through holes 105, the first movable electrode 106, the second movable electrode 107, the first fixed electrode 108, the second fixed electrode 109, a first movable member 121, a second movable member 122, second beams 123, a third movable electrode 124, a fourth movable electrode 125, a lower substrate 131, a recessed portion 132 of the lower substrate 131, and fixed electrodes 133 and 134 formed on the lower substrate 131.

The frame-type gyroscope is characterized in that two movable members (movable members 121 and 122 in the eighth embodiment of the present invention) are provided, and in that the respective movable members are supported in such a manner that oscillation is easily generated in different directions. In the gyroscope, there is employed a system in which a given movable member is caused to oscillate with a constant amplitude and a displacement of the movable member (hereinafter, referred to as "detection oscillation") due to a Coriolis force generated by an input of an angular velocity from the outside is detected. A direction of the initial oscillation (hereinafter, referred to as "reference oscillation") of the movable member, an axial direction in which the angular velocity is detected, and a direction in which the Coriolis force is generated are perpendicular to each other. In the frame-type gyroscope, the movable member for generating the reference oscillation and the movable member for detecting the Coriolis force are different from each other. Accordingly, by production of a mechanism in which the oscillation is easily generated (easy movement) in the reference oscillation direction and in the detection oscillation direction, while the oscillation is hardly generated (difficult movement) in the other directions, the frame-type gyroscope can be easily achieved.

Hereinafter, the frame-type gyroscope according to the eighth embodiment of the present invention will be described in detail.

In FIG. 9, the gyroscope according to the eight embodiment of the present invention has a structure in which the substrate 101 and the lower substrate 131 are bonded together. The first fixed electrode 108, the second fixed electrode 109, the first movable electrode 106, the second movable electrode 107, the third movable electrode 124, and the fourth movable electrode 125 are each insulated from other electrodes by the method described in the above embodiments. The respective electrodes are electrically wired to each other via the movable member 102, the beams 103, the second movable member 122, the second beams 123, and the like.

By the use of the third movable electrode 124 and the fourth movable electrode 125, and the fixed electrode 133 and the fixed electrode 134 which are formed on the lower substrate 131, the second movable member 122 is caused to generate the reference oscillation in a given cycle in directions indicated by arrows Y. The first movable member 102 (121) is held by the substrate 101 with the beams 103 so as not to be easily moved in directions other than the directions indicated by the arrows X. As a result, the first movable member 102 is held in a stationary state without being affected by the reference oscillation of the second movable member 122.

In this case, when an angular velocity in a direction indicated by an arrow Z is applied to the gyroscope, the second movable member 122 receives a force in the directions indicated by the arrows X by means of the generated Coriolis force. However, the second movable member 122 is held by the second beams 123 so as not to be easily moved in directions other than the directions indicated by the arrows Y. For this reason, the force applied to the second movable member 122 in the directions indicated by the arrows X is directly transmitted to the movable member 102 (121). The movable member 102, which is held so as to be easily moved in the directions indicated by the arrows X, generates the detection oscillation in the directions indicated by the arrows X. At this time, a positional relationship between the movable member 102 and the second movable member 122 in the directions indicated by the arrows X is not changed. In this case, the electrostatic capacitance between the first fixed electrode 106 and the first movable electrode 108, and the electrostatic capacitance between the second fixed electrode 107 and the second movable electrode 109 are detected, thereby detecting the magnitude of the detection oscillation and measuring the angular velocity based on the magnitude of the detection oscillation.

According to the eighth embodiment of the present invention, different potentials can be applied to the respective electrodes 124, 125, 133, and 134 for generating the reference oscillation. Accordingly, the oscillation can be generated with good efficiency and large reference oscillation can be generated. The magnitude of the reference oscillation is associated with the detection sensitivity of the gyroscope, whereby the gyroscope with high sensitivity can be provided. In addition, the electrodes 106, 107, 108, and 109 for detecting detection signals can be set to different potentials. Accordingly, a carrier signal for detection can be applied thereto, thereby enabling extraction of signals with less noise.

Further, electrostatic comb teeth portions can be easily formed also on a structural member having a large thickness by processing the silicon substrate, thereby improving the efficiency in drive of the sensor and detection by the sensor. In addition, the deformation of the microstructural member due to the stress caused in the insulating portions of the oxidized regions can be reduced. For reasons as described above, by the use of the structural member of the present invention including the movable member for sensing the force caused by the acceleration velocity, the gyroscope with higher performance can be provided.

Ninth Embodiment

Figure 10:
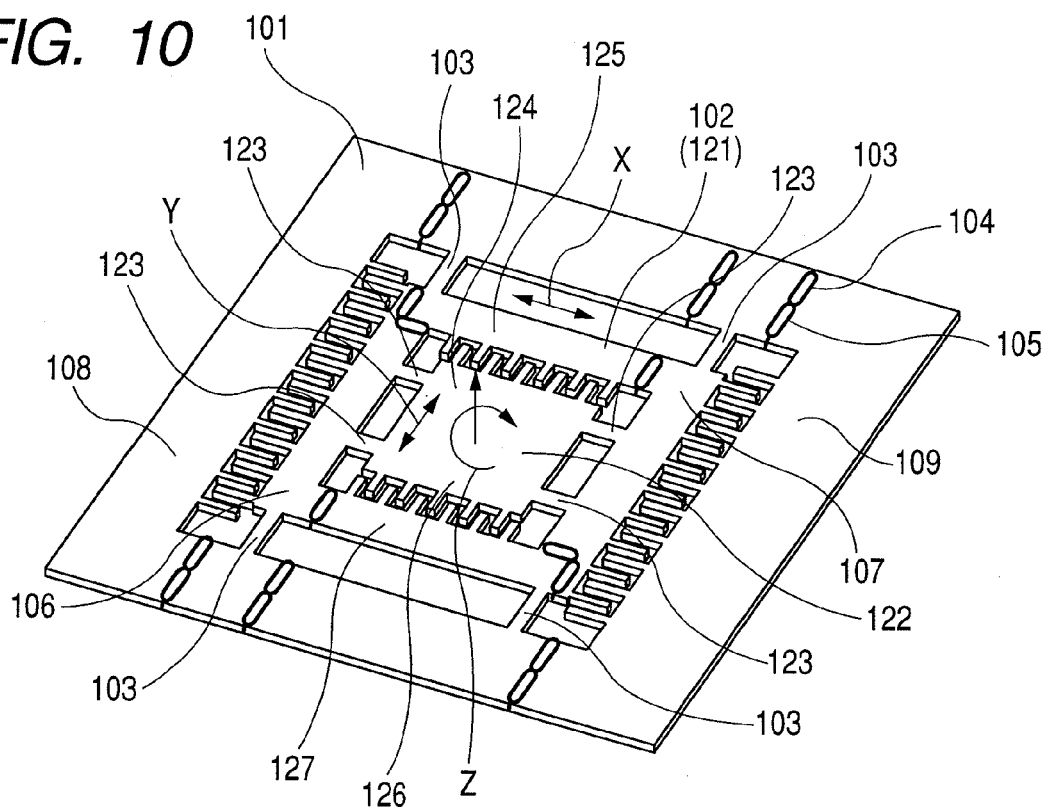
FIG. 10 is a perspective view of another form of a frame-type gyroscope according to a ninth embodiment of the present invention.

With reference to FIG. 10, another frame-type gyroscope according to a ninth embodiment of the present invention will be described. The ninth embodiment is different from the above embodiments in that the structural member of the present invention is applied to the frame-type gyroscope illustrated in FIG. 10.

FIG. 10 is a perspective view of the frame-type gyroscope according to the ninth embodiment of the present invention. As illustrated in FIG. 10, the gyroscope includes the substrate 101, the movable member 102, the beams 103, the thermally oxidized films 104, the through holes 105, the first movable electrode 106, the second movable electrode 107, the first fixed electrode 108, the second fixed electrode 109, the first movable member 121, the second movable member 122, the second beams 123, the third movable electrode 124, the fourth movable electrode 125, a fifth movable electrode 126, and a sixth movable electrode 127.

The frame-type gyroscope according to the ninth embodiment of the present invention is different from that of the eighth embodiment of the present invention in the following points. That is, in the frame-type gyroscope according to the ninth embodiment of the present invention, the fixed electrodes 133 and 134 formed on the lower substrate 131 illustrated in FIG. 9 of the eighth embodiment are arranged on the first movable member 121 as the fourth movable electrode 125 and the sixth movable electrode 127.

The first fixed electrode 108, the second fixed electrode 109, the fourth movable electrode 125, and the sixth movable electrode 127 are each insulated from other electrodes by the method described in the above embodiments. In addition, the first movable electrode 106, the second movable electrode 107, the third movable electrode 124, and a fifth movable electrode 126 are electrically connected to each other, and are each insulated from the other electrodes by the method described in the above embodiments. The respective electrodes are electrically wired to each other via the movable member 102, the beams 103, the second movable member 122, the second beams 123, and the like.

By the use of the first movable electrode 106 and the first fixed electrode 108, and the second movable electrode 107 and the second fixed electrode 109, the first movable member 102 (121) is caused to generate or produce reference oscillation in a given cycle in the directions indicated by the arrows X. The second movable member 122 is held by the second beams 123 so as not to be easily moved in directions other than the directions indicated by the arrows Y. Accordingly, the second movable member 122 also produces reference oscillation in the same cycle in the same directions indicated by the arrows X as in the first movable member 102.

In this case, when the angular velocity in the direction indicated by the arrow Z is applied to the gyroscope, the first movable member 102 and the second movable member 122 receive a force in the directions indicated by the arrows Y by the generated Coriolis force. However, the first movable member 102 is held by the first beams 103 so as not to be easily moved in directions other than the directions indicated by the arrows X. For this reason, only the second movable member 122 is moved in the directions indicated by the arrows Y to thereby generate detection oscillation. In this case, an electrostatic capacitance between the third movable electrode 124 and the fourth movable electrode 125, and an electrostatic capacitance between the fifth movable electrode 126 and the sixth movable electrode 127 are detected, thereby detecting the magnitude of the detection oscillation and measuring the angular velocity based on the magnitude of the detection oscillation.

In the frame-type gyroscope according to the ninth embodiment of the present invention, in the reference oscillation, a positional relationship between the first movable member 102 and the second movable member 122 is not changed. Further, the detection oscillation is detected by detecting a relative position between the first movable member 102 and the second movable member 122. For reasons as described above, in the frame-type gyroscope according to the ninth embodiment of the present invention, even when the reference oscillation contains wobbling in directions other than the directions indicated by the arrows X, noise due to the reference oscillation is hardly generated in the detection signals.

By means of the insulation method using the oxidized region according to the ninth embodiment of the present invention, the third movable electrode 124 and the fourth movable electrode 125, and the fifth movable electrode 126 and the sixth movable electrode 127, which are used for detecting the detection oscillation, can be easily arranged on the movable member 102. In addition, a structural member which is symmetrical with respect to a thickness direction of the substrate can be obtained, whereby wobbling in the reference oscillation can be reduced. For reasons as described above, when the structural member including the insulating portions of the oxidized regions according to the present invention is applied to the frame-type gyroscope, the gyroscope with higher precision can be provided.

In the above-mentioned frame-type gyroscope, the direction of the reference oscillation, the direction of the detection oscillation, and which of the movable members is caused to generate detection oscillation are not limited to those of the above-mentioned structure. The structural member according to the present invention can also be applied to other structures with any other combination thereof, for detecting the angular velocity.

Tenth Embodiment

Figure 11:
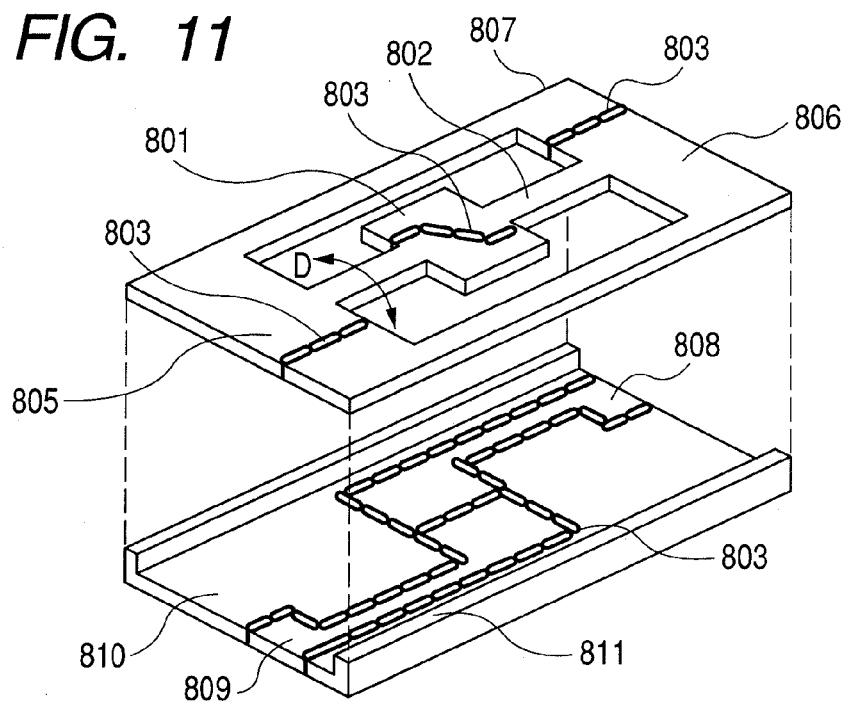
FIG. 11 is a perspective view of an optical scanner according to a tenth embodiment of the present invention.

With reference to FIG. 11, an optical scanner according to a tenth embodiment of the present invention will be described. The tenth embodiment is different from the above embodiments in that the structural member of the present invention is applied to the optical scanner illustrated in FIG. 11.

FIG. 11 is a perspective view of the optical scanner according to the tenth embodiment of the present invention. As illustrated in FIG. 11, the optical scanner, which is in a state where upper and lower substrates are separated from each other, includes a movable member 801 having an optical deflection element such as a mirror, a support beam 802 such as a torsion spring, insulating portions 803 of the oxidized regions, a first electrode portion 805, a second electrode portion 806, an upper substrate 807, a third electrode 808, a fourth electrode 809, a lower substrate 810, and a spacer 811.

The movable member 801 is swingably supported by the support beam 802 with respect to the upper substrate 807 in movable directions indicated by arrows D. The first electrode portion 805 and the second electrode portion 806 of the movable member 801, which are insulated from each other by the insulating portions 803, are arranged so as to be respectively opposed to the fourth electrode portion 809 and the third electrode portion 808 that are formed on the lower substrate 810 and are similarly insulated from each other by the insulating portions 803, with an appropriate interval by the spacer 811. Accordingly, when an applied voltage is controlled in such a manner that a potential difference is alternately generated between the first electrode portion 805 and the fourth electrode portion 809, and between the second electrode portion 806 and the third electrode portion 808, and attraction is caused to act alternately between the electrodes, the movable member 801 is caused to swing about an axis of the support beam 802. As a result, light incident on the optical deflection element on the movable member 801 is deflected.

By means of the insulation method using the oxidized regions according to the tenth embodiment of the present invention, the deformation of the structural member due to the stress caused in the insulating portions of the oxidized regions is reduced, and the first electrode portion 805 and the second electrode portion 806 can be easily arranged on the swingable movable member 801. Further, the third electrode portion 808 and the fourth electrode portion 809 can be easily disposed also on the lower substrate 810. For reasons as described above, when the structural member of the present invention including the insulating portions of the oxidized regions is applied to the optical scanner, an optical scanner with higher performance can be provided. Note that, in some cases, it is necessary to arrange the oxidized regions or to form a reflection film or the like on the surface of the oxidized regions so as to prevent the portions of the oxidized regions from unnecessarily effecting optical characteristics.

Eleventh Embodiment

Figure 12:
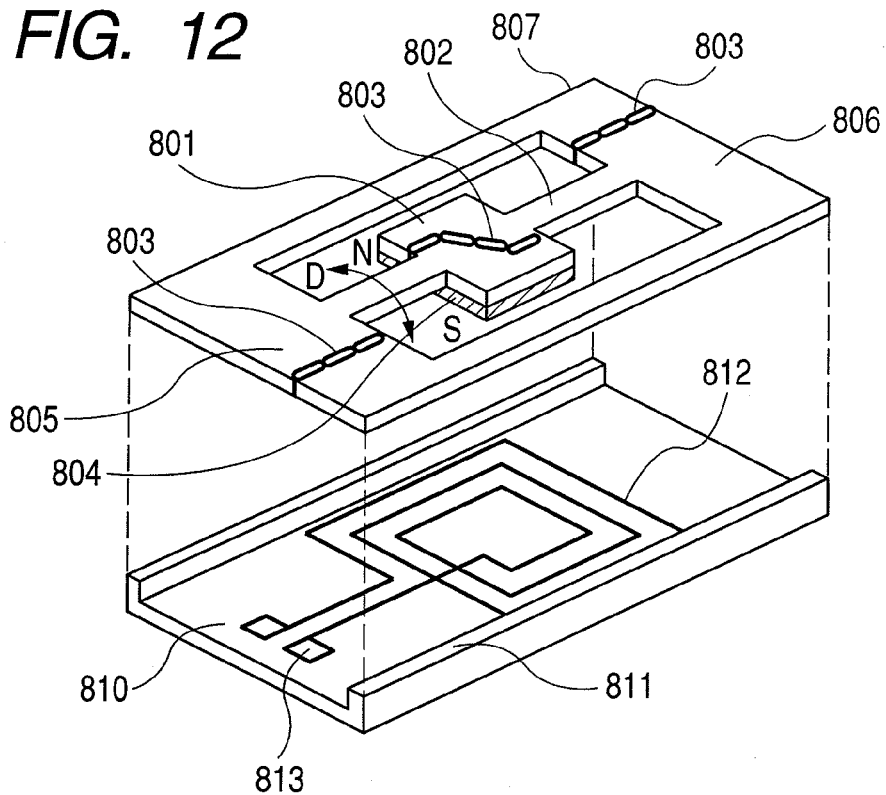
FIG. 12 is a perspective view of an electric potential sensor according to an eleventh embodiment of the present invention.
Figure 13:
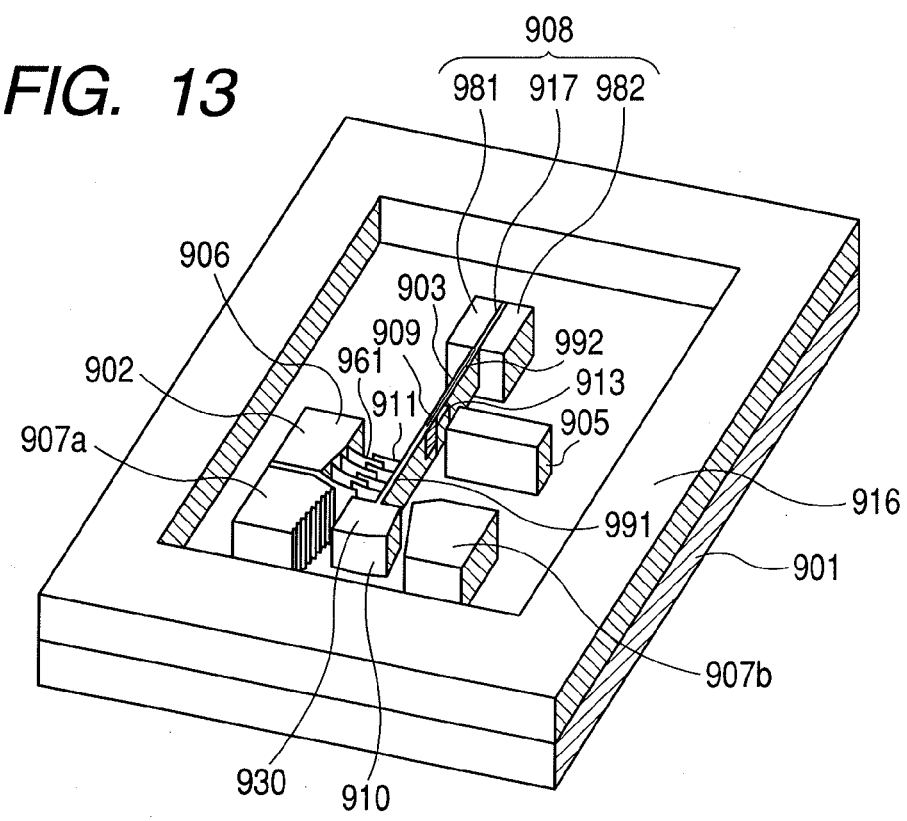
FIG. 13 is a perspective view of an acceleration switch disclosed in Japanese Patent Application Laid-Open No. 2000-065855.
Figure 14:
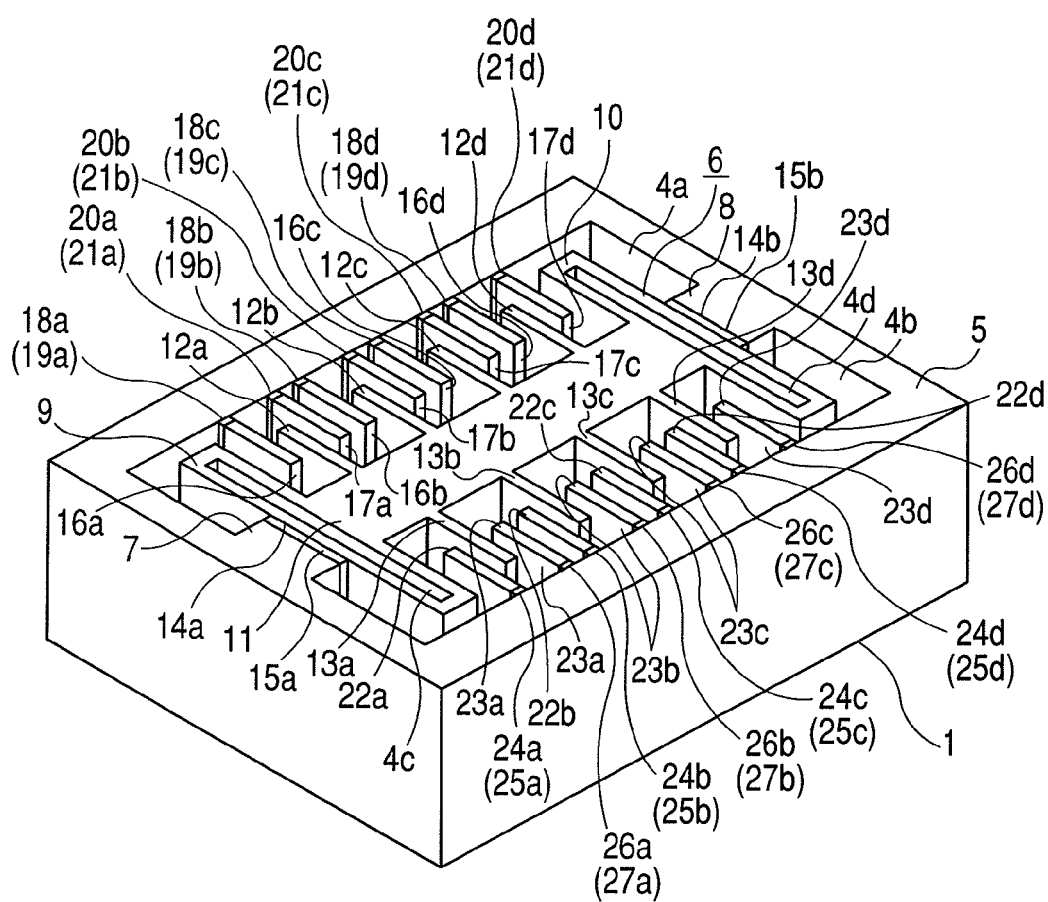
FIG. 14 is a perspective view of a semiconductor dynamic sensor disclosed in Japanese Patent Application Laid-Open No. 2000-286430.

With reference to FIG. 12, description is given of an electromagnetic drive electric potential sensor according to an eleventh embodiment of the present invention. The eleventh embodiment is different from the above embodiments in that the structural member of the present invention is applied to the electric potential sensor illustrated in FIG. 12.

FIG. 12 is a perspective view of the electric potential sensor according to the eleventh embodiment of the present invention. As illustrated in FIG. 12, the electric potential sensor, which is in a state where upper and lower substrates are separated from each other, includes the movable member 801, the support beam 802 such as a torsion spring, the insulating portions 803 of the oxidized regions, a magnet 804 fixed to a back surface of the movable member 801 with an N pole and an S pole, a first detection electrode portion 805, a second detection electrode portion 806, the upper substrate 807, the lower substrate 810, the spacer 811, a coil 812, and a lead-out electrode 813.

In the eleventh embodiment of the present invention, the movable member 801 is held by the torsion spring 802, and the torsion spring 802 is fixed to the upper substrate 807. As illustrated in FIG. 12, the movable member 801, the torsion spring 802, and the upper substrate 807 are divided into the first detection electrode portion 805 and the second detection electrode portion 806 which are insulated from each other by the insulating portions 803. On the lower substrate 810, the coil 812 is disposed so as to be opposed to the first detection electrode portion 805 and the second detection electrode portion 806, with an appropriate interval by the spacer 811.

An AC drive signal is applied to the coil 812, thereby generating a mechanical oscillation in the movable member 801 according to a relationship between a direction of a magnetic field of the magnet 804 and a direction in which a current flows through the coil 812 (Fleming's left-hand rule). The movable member 801 generates torsional oscillation in the directions indicated by the arrows D.

In the eleventh embodiment of the present invention, potential measurement is performed in the following manner. An object to be measured such as a charged photosensitive member is positioned closer to the first detection electrode portion 805 and the second detection electrode portion 806 to cause the movable member 801 to oscillate, thereby mechanically changing the capacitance between the object to be measured and the detection electrode portion. As a result, a small change in charge, which is induced in the detection electrode portions 805 and 806 by electrostatic induction, is detected through current signals, thereby measuring the potential of the object to be measured. In this case, the signals from the detection electrode portions 805 and 806 are changed in opposite phases. Accordingly, those signals are subjected to differential processing, whereby the electric potential sensor with a higher ratio of removal of in-phase noise can be provided.

By the use of the electromagnetic actuator with the above structure, a large oscillation is obtained with good efficiency. In addition, by the use of the insulation method using the oxidized regions according to the eleventh embodiment of the present invention, the deformation of the structural member due to the stress caused in the insulating portions of the oxidized regions is reduced, and the first detection electrode portion 805 and the second detection electrode portion 806 can be easily arranged on the swingable movable member 801. For this reason, detection signals having a larger stable charge can be obtained with a smaller structure. Accordingly, in the electric potential sensor according to the eleventh embodiment of the present invention, by the use of the structural member of the present invention including the movable members each having the detection electrode portion for outputting electrical signals corresponding to the potential of the object to be measured, an electric potential sensor with higher precision and with a smaller structure can be materialized.

In the above description, the acceleration sensor, the gyroscope, the optical scanner, and the electric potential sensor are illustrated, but the scope of application of the structural member according to the present invention is not limited thereto. The present invention can be used in devices other than the semiconductor sensor and the like, as long as the structural member having a plurality of conductive regions electrically insulated from each other can be applied to the devices.

Further, application of the present invention is not limited to the arrangement of the insulating portions in the acceleration sensor, the gyroscope, and the like, the combination of the electrodes, the method of dividing the regions, and the wiring method as illustrated in the above embodiments. The present invention can be applied to any structure as long as the structure can provide functions necessary for the actuator, the sensor, and the like, has a mechanical strength necessary for the structural member such as the microstructural member, and can suppress the deformation of the structural member due to the stress within specifications.

Further, in the above embodiments, silicon is used as the substrate as the base material. Alternatively, any material other than silicon can be used as long as the oxide has an insulation property and through holes or trenches can be formed in the material. In addition, as the method of forming the through holes and the trenches, etching is used in the above embodiments. Alternatively, the through holes or the trenches may be formed by laser processing or the like with the thickness or material properties of the base material and the size or the like of the through holes or the trenches taken into account.

This application claims the benefit of Japanese Patent Application No. 2007-009657, filed Jan. 19, 2007, which is hereby incorporated by reference herein in its entirety.

The invention claimed is:

1. A structural member made of a silicon substrate comprising:
    said substrate;
    a plurality of conductive regions;
    a plurality of oxidized regions,
    said plurality of conductive regions being electrically insulated from each other by said oxidized regions, wherein said oxidized regions are connected to each other to form an integrated insulating region between said plurality of conductive regions,
    wherein each of said plurality of oxidized regions is made of an oxide of said substrate, and formed from an inner surface of a through hole or a trench and grown inside said substrate to contact an oxidized region formed from an inner surface of an adjacent through hole or trench, and
    wherein each said oxidized region formed from an inner surface of a corresponding through hole or trench and grown inside said substrate to contact an oxidized region formed from an inner surface of an adjacent trench has a thickness that exceeds the thickness of said substrate under a bottom surface of a corresponding through hole or trench.

2. A structural member according to claim 1, wherein the closest distance between two adjacent through holes or trenches is 2 μm or smaller.

3. A structural member according to claim 1, wherein the difference between the thickness of a portion of said substrate in which each said through hole or trench is formed and the depth of each said through hole or trench, which corresponds to the thickness of said substrate existing under the bottom surface of each of said through hole or trench, is 2 μm or smaller.

4. A structural member according to claim 1, wherein said through holes or trenches have a depth of 100 μm or smaller.

5. An acceleration sensor comprising the structural member according to claim 1, wherein the structural member comprises a movable member for sensing an accelerated velocity.

6. A gyroscope comprising the structural member according to claim 1, wherein the structural member comprises a movable member for sensing a force caused by an angular velocity.

7. An actuator comprising the structural member according to claim 1, wherein the structural member comprises a movable member for converting an input force of electric energy into physical motion.

8. An electric potential sensor comprising the structural member according to claim 1, wherein the structural member comprises a movable member having a detection electrode portion for outputting an electrical signal according to a potential of an object to be measured.

9. A method of producing a structural member having a plurality of conductive regions electrically insulated from each other, comprising the steps of:
    forming a plurality of through holes or trenches so as to be arranged at intervals on a substrate made of a base material;
    thermally oxidizing the base material from an inner surface of each of the plurality of through holes or trenches; and
    growing oxidized regions of the base material inside the substrate, so that oxidized regions formed from inner surfaces of two adjacent through holes or trenches are in contact with each other and have a thickness that exceeds the thickness of the substrate under a bottom surface of a corresponding through hole or trench, thereby forming continuous oxidized regions by which the plurality of conductive regions are electrically insulated.

10. A method of producing a structural member according to claim 9, wherein said step of forming the oxidized regions comprises forming silicon nitride on a portion other than the internal surface of the through holes or trenches in the substrate before thermally oxidizing the substrate.

* * * * *